(12) United States Patent
Park et al.

(10) Patent No.: US 11,676,816 B2
(45) Date of Patent: Jun. 13, 2023

(54) METHOD OF FORMING SEMICONDUCTOR DEVICE

(71) Applicant: Samsung Electronics Co., Ltd., Suwon-si (KR)

(72) Inventors: Sung Min Park, Seongnam-si (KR); Se Myeong Jang, Gunpo-si (KR); Bong Soo Kim, Yongin-si (KR); Je Min Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 251 days.

(21) Appl. No.: 16/530,286

(22) Filed: Aug. 2, 2019

(65) Prior Publication Data

US 2020/0152462 A1 May 14, 2020

(30) Foreign Application Priority Data

Nov. 12, 2018 (KR) .................. 10-2018-0138093

(51) Int. Cl.
| | |
|---|---|
| *H01L 21/033* | (2006.01) |
| *H01L 21/3213* | (2006.01) |
| *H01L 21/308* | (2006.01) |
| *H01L 21/762* | (2006.01) |

(52) U.S. Cl.
CPC ...... *H01L 21/0337* (2013.01); *H01L 21/0338* (2013.01); *H01L 21/3086* (2013.01); *H01L 21/3088* (2013.01); *H01L 21/32139* (2013.01); *H01L 21/76224* (2013.01)

(58) Field of Classification Search
CPC .......... H01L 21/32139; H01L 21/0337; H01L 21/3086; H01L 21/0338; H01L 21/3088; H01L 21/0334; H01L 21/3083
See application file for complete search history.

(56) References Cited

U.S. PATENT DOCUMENTS

| | | | |
|---|---|---|---|
| 7,704,882 B2 | 4/2010 | Lee et al. | |
| 8,216,944 B2 | 7/2012 | Kwon et al. | |
| 8,349,200 B2 | 1/2013 | Yi et al. | |
| 8,642,428 B2 | 2/2014 | Kim | |

(Continued)

FOREIGN PATENT DOCUMENTS

| | | |
|---|---|---|
| JP | 4095588 | 1/2006 |
| JP | 2016-161886 | 9/2016 |

(Continued)

*Primary Examiner* — Lauren R Bell
(74) *Attorney, Agent, or Firm* — Myers Bigel, P.A.

(57) ABSTRACT

A method of forming a semiconductor device includes forming first sacrificial patterns on a lower structure, forming first remaining mask layers having a "U" shape between the first sacrificial patterns to be in contact with the first sacrificial patterns, forming first remaining mask patterns by pattering the first remaining mask layers, each of the first remaining mask patterns including a horizontal portion, parallel to an upper surface of the lower structure, and a vertical portion, perpendicular to the upper surface of the lower structure, forming second mask patterns spaced apart from the vertical portions of the first remaining mask patterns, removing the first sacrificial patterns remaining after forming the second mask patterns, and forming first mask patterns by etching the horizontal portions of the first remaining mask patterns.

19 Claims, 24 Drawing Sheets

(56) References Cited

U.S. PATENT DOCUMENTS

| | | | |
|---|---|---|---|
| 9,099,400 B2 | 8/2015 | Huang et al. | |
| 9,496,267 B2 | 11/2016 | Tonari et al. | |
| 2008/0014752 A1* | 1/2008 | Cha | H01L 21/0338 438/700 |
| 2009/0042391 A1* | 2/2009 | Chen | H01L 21/0338 438/692 |
| 2012/0034782 A1 | 2/2012 | Kim | |
| 2012/0129316 A1 | 5/2012 | Jung | |
| 2012/0146121 A1* | 6/2012 | Kim | H01L 27/10876 257/315 |
| 2016/0254153 A1* | 9/2016 | Park | H01L 21/76843 438/695 |
| 2016/0293443 A1* | 10/2016 | Ban | H01L 21/0276 |
| 2018/0138078 A1 | 5/2018 | Farrell et al. | |

FOREIGN PATENT DOCUMENTS

| | | |
|---|---|---|
| KR | 10-2012-0054348 | 5/2012 |
| KR | 10-2018-0035968 | 4/2018 |

* cited by examiner

METHOD OF FORMING SEMICONDUCTOR DEVICE

CROSS-REFERENCE TO RELATED APPLICATION

This application claims benefit of priority to Korean Patent Application No. 10-2018-0138093 filed on Nov. 12, 2018 in the Korean Intellectual Property Office, the disclosure of which is incorporated herein by reference in its entirety.

FIELD

The present inventive concepts relate to methods of forming semiconductor devices, and more particularly, to methods of forming fine patterns and methods of forming semiconductor devices using the same.

BACKGROUND

As semiconductor devices have become highly integrated, the sizes of patterns of the semiconductor devices are decreasing. Due to optical resolution limitations of an exposure apparatus used to form such patterns, there may be limits in forming fine patterns using such an exposure apparatus.

SUMMARY

An aspect of the present inventive concepts is to provide methods of forming a semiconductor device, in which a fine pattern may be formed.

According to an aspect of the present inventive concepts, a method of forming a semiconductor device includes forming first sacrificial patterns on a lower structure; forming first remaining mask layers having a "U" shape between the first sacrificial patterns to be in contact with the first sacrificial patterns; forming first remaining mask patterns by pattering the first remaining mask layers, each of the first remaining mask patterns including a horizontal portion, parallel to an upper surface of the lower structure, and a vertical portion, perpendicular to the upper surface of the lower structure; forming second mask patterns spaced apart from the vertical portions of the first remaining mask patterns; removing the first sacrificial patterns remaining after forming the second mask patterns; and forming first mask patterns by etching the horizontal portions of the first remaining mask patterns.

According to an aspect of the present inventive concepts, a method of forming a semiconductor device includes forming first sacrificial patterns on a lower structure, each of the first sacrificial patterns having a first width, and the first sacrificial patterns being spaced apart from each other by a first distance, greater than the first width; forming first remaining mask patterns between the first sacrificial patterns to be in contact with the first sacrificial patterns, each of the first remaining mask patterns including a horizontal portion, parallel to an upper surface of the lower structure, and a vertical portion, perpendicular to the upper surface of the lower structure; forming second mask patterns spaced apart from the vertical portions of the first remaining mask patterns; removing the first sacrificial patterns remaining after forming the second mask patterns; and forming first mask patterns by anisotropically etching the first remaining mask patterns.

According to an aspect of the present inventive concepts, a method of forming a semiconductor device includes forming first remaining mask patterns on a lower structure, the first remaining mask patterns each including a horizontal portion, parallel to an upper surface of the lower structure, and a vertical portion extending from a portion of the horizontal portion in a direction perpendicular to the upper surface of the lower structure; forming second mask patterns on the lower structure, after forming the first remaining mask patterns; and performing anisotropic etching on the first remaining mask patterns and the second mask patterns. The horizontal portions of the first remaining mask patterns are etched by the anisotropic etching, to be formed as first mask patterns, and the second mask patterns are formed of first patterns in contact with the horizontal portions of the first remaining mask patterns, and second patterns spaced apart from the first remaining mask patterns.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, various examples of methods of forming a semiconductor device according to some embodiments of the present inventive will be described with reference to the drawings. An example of methods of forming a semiconductor device according to an embodiment will be described with reference to FIGS. 1 to 16. In FIGS. 1 to 16, FIGS. 1, 3, 5, 7, 9, 11, 13 and 15 are plan views illustrating an example of methods of forming a semiconductor device according to an embodiment, and FIGS. 2, 4A, 4B, 4C, 6, 8, 10A, 10B, 12A, 12B, 14 and 16 are cross-sectional views illustrating regions taken along line I-I' of the plan views of FIGS. 1, 3, 5, 7, 9, 11, 13 and 15.

Figure 1:
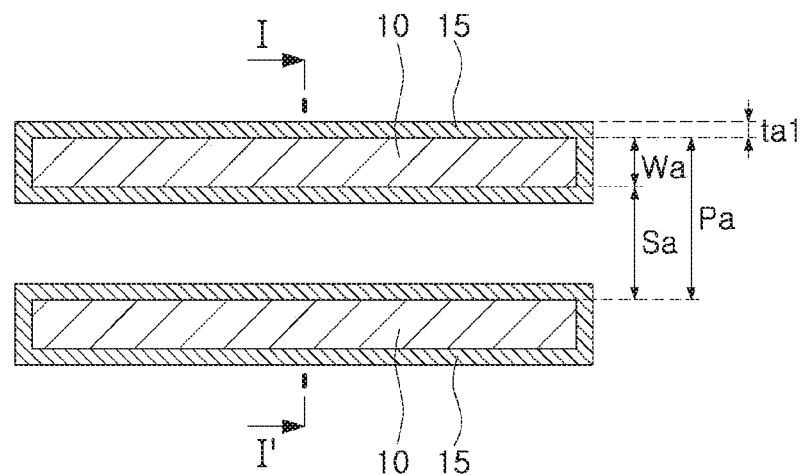
FIGS. 1 to 16 are views illustrating an example of methods of forming a semiconductor device according to some embodiments of the present inventive concepts.
Figure 2:
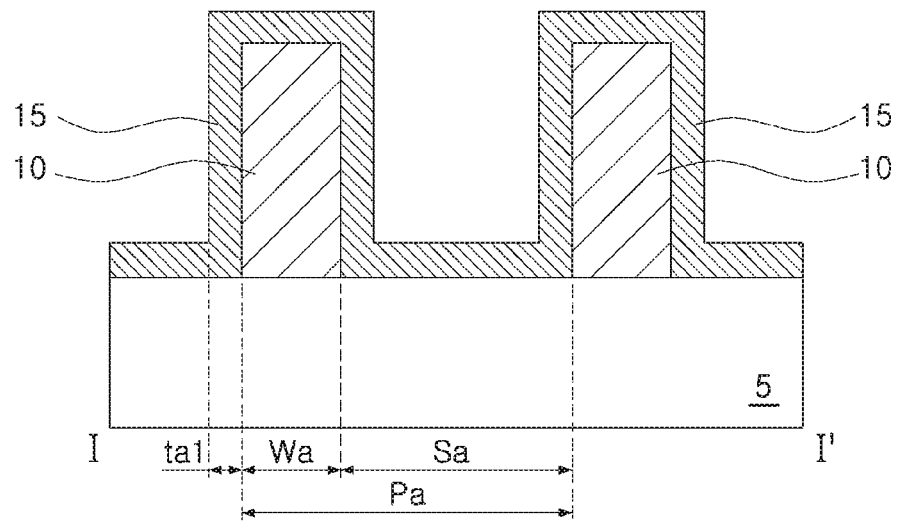

Referring to FIGS. 1 and 2, first sacrificial patterns 10 may be formed on a lower structure 5. The first sacrificial patterns 10 may be formed to have a linear shape. The first sacrificial patterns 10 may be formed of a spin-on hardmask (SOH) material. For example, the first sacrificial patterns 10 may be formed of a carbon-containing material. Forming the first sacrificial patterns 10 may include forming a sacrificial material layer on the lower structure 5 and patterning the sacrificial material layer using a photolithography process using an exposure apparatus. The terms first, second, third, etc. are used herein merely to distinguish or differentiate one element from another.

A first mask layer 15 may be conformally formed on the lower structure 5 having the first sacrificial patterns 10. For example, the first mask layer 15 may extend on or cover upper surfaces and side surfaces of the respective first sacrificial patterns 10 and portions of the lower structure 5 provided between the first sacrificial patterns 10. As used herein, an element that covers another element or surface may partially or completely cover the element or surface.

In an example, the first mask layer 15 may be formed of silicon oxide using an atomic layer deposition (ALD) process. In some embodiments, a material of the first mask layer 15 is not limited to silicon oxide, but may be formed of another material such as silicon oxynitride (SiON) instead of silicon oxide.

The first mask layer 15 may be formed at a temperature at which the first sacrificial patterns 10 are not deformed. For example, when the first sacrificial patterns 10 are formed of the SOH material formed at a first temperature, the first mask layer 15 may be formed at a second temperature lower than the first temperature. For example, when the first sacrificial patterns 10 are formed at about 260° C., the first mask layer 15 may be formed at a temperature lower than 260° C., for example, lower than 250° C.

The first sacrificial patterns 10 may be formed at a first pitch Pa. Each of the first sacrificial patterns 10 may have a first width Wa. The first sacrificial patterns 10 may be spaced apart from each other by a first distance Sa. A ratio of the first width (Wa) to the first distance (Sa) may be about 3 to 7. The sum of the first width Wa and the first distance Sa may be the first pitch Pa. A first thickness ta1 of the first mask layer 15 may be about one-third of the first width Wa in size.

Figure 3:
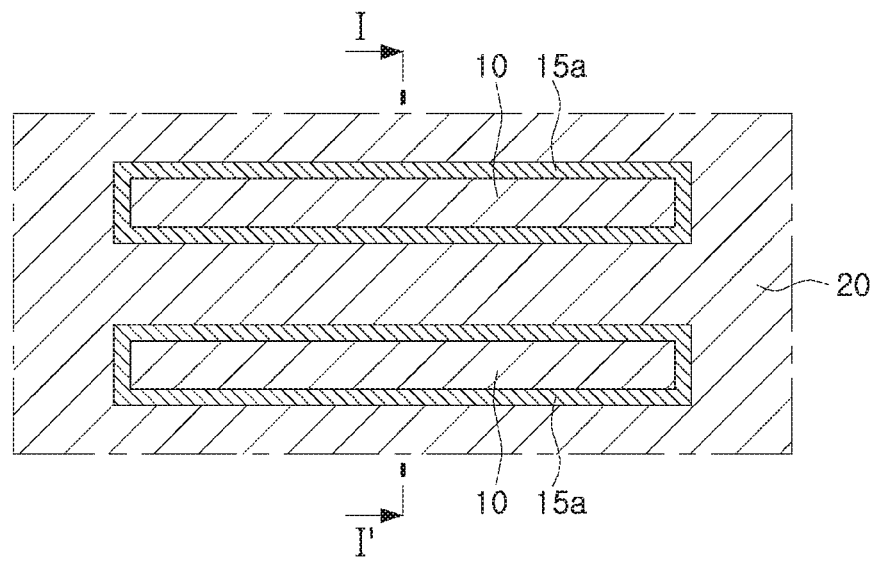
Figure 4A:
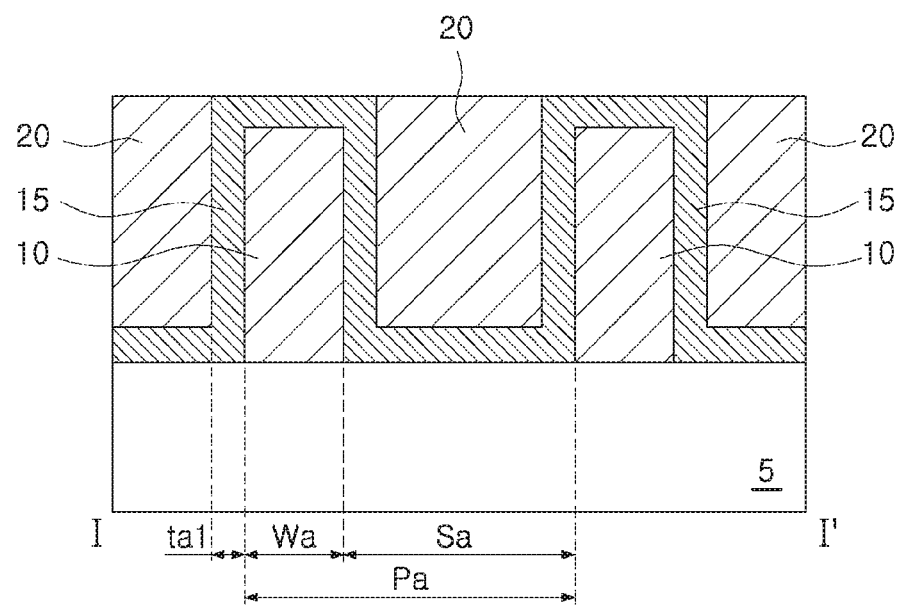

Referring to FIGS. 3 and 4A, second sacrificial patterns 20 may be formed on the first mask layer 15 to fill spaces between the first sacrificial patterns 10. As used herein, an element that fills a space or region may partially or completely fill the space or region. Forming the second sacrificial patterns 20 may include forming a sacrificial material layer on the first mask layer 15 and etching the sacrificial material layer until the first mask layer 15 formed on the first sacrificial patterns is exposed. The second sacrificial patterns 20 may be formed of the same material as that of the first sacrificial patterns 10.

Figure 4B:
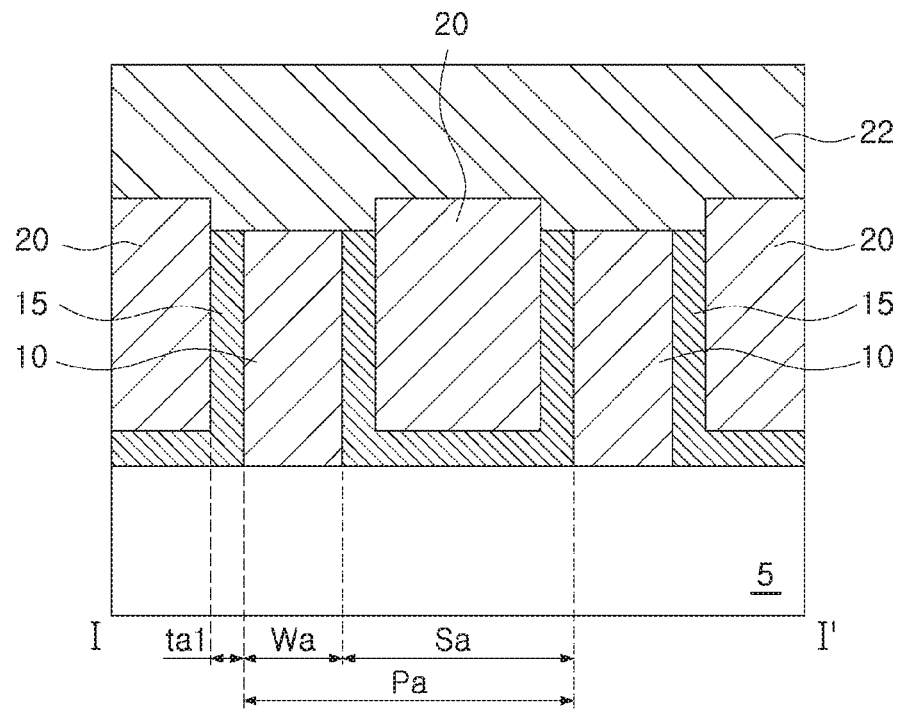

Referring to FIGS. 3 and 4B, portions of the first mask layer 15 located on the first sacrificial patterns 10 may be removed to expose upper surfaces of the first sacrificial patterns 10. It will be understood that removed elements described herein may not be completely removed. The first mask layer 15 may be formed as first remaining mask layers 15a having a "U" shape, located between the first sacrificial patterns 10 and located below or under the second sacrificial patterns 20. A sacrificial capping layer 22 may be formed on the first sacrificial patterns 10 and the second sacrificial patterns 20. The sacrificial capping layer 22 may be formed of the same material as that of the first and second sacrificial patterns 10 and 20.

Figure 4C:
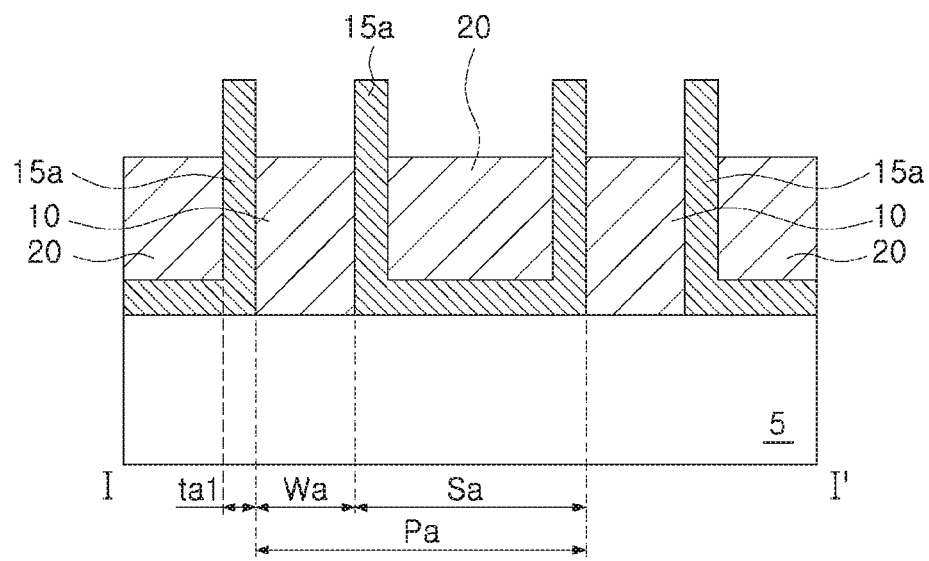

Referring to FIGS. 3 and 4C, the sacrificial capping layer 22 and the first and second sacrificial patterns 10 and 20 may be sequentially etched to expose upper regions of the first remaining mask layers 15a. The sacrificial capping layer 22 may be etched and removed and the first and second sacrificial patterns 10 and 20 may be partially etched to be reduced in height, to expose the upper regions of the first remaining mask layers 15a.

In some embodiments, after forming the sacrificial capping layer 22, the sacrificial capping layer 22 and the first and second sacrificial patterns 10 and 20 are etched in order, and thus, the first and second sacrificial patterns 10 and 20 may be reduced in height, to have substantially the same height.

Figure 5:
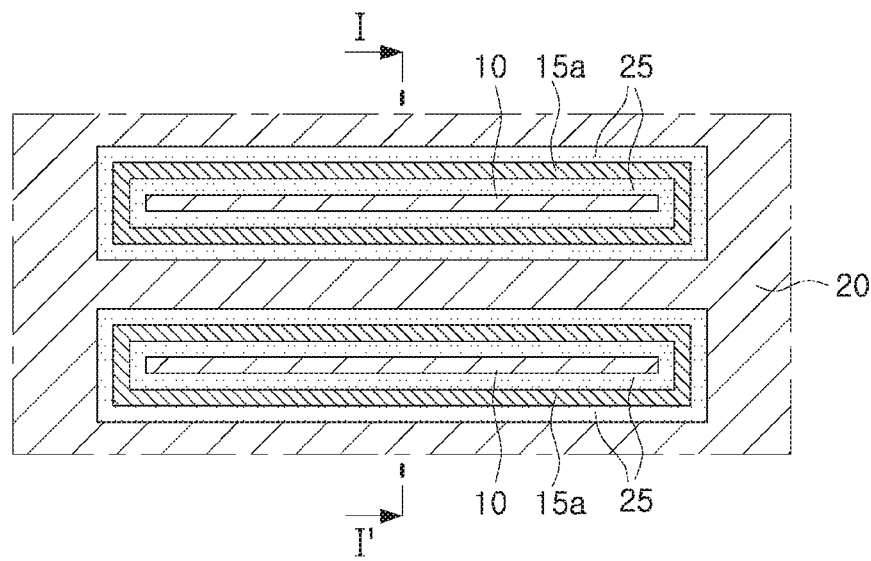
Figure 6:
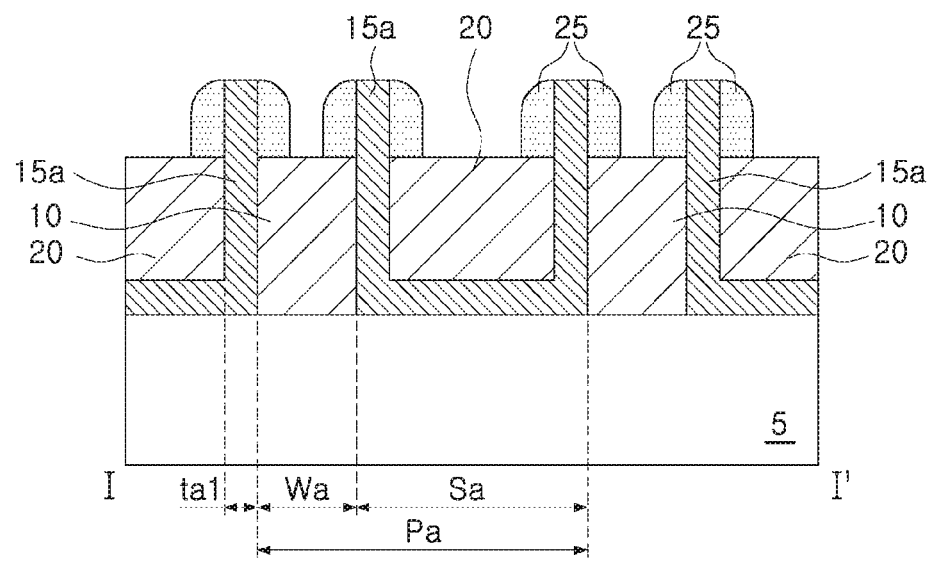

Referring to FIGS. 5 and 6, upper spacers 25 may be formed on side surfaces of the upper regions of the first remaining mask layers 15a. The upper spacers 25 may be formed on the first and second sacrificial patterns 10 and 20 and may extend on or cover the side surfaces of the upper regions of the first remaining mask layers 15a.

Forming the upper spacers 25 may include conformally forming a spacer material layer 15 on the lower structure 5 having the first remaining mask layers 15a and the first and second sacrificial patterns 10 and 20 reduced in height, and anisotropically etching the spacer material layer. The upper spacers 25 may be formed of a material having etch selectivity with the first and second sacrificial patterns 10 and 20 and the first remaining mask layers 15a. For example, the upper spacers 25 may be formed of polysilicon or silicon nitride. The upper spacers 25 may be formed at a temperature that does not deform the first sacrificial patterns 10, as in the first mask layer 15 (see FIGS. 1 and 2) described above.

Figure 7:
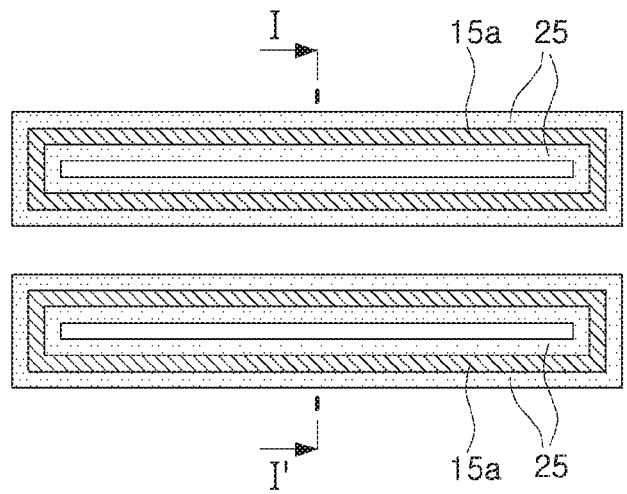
Figure 8:
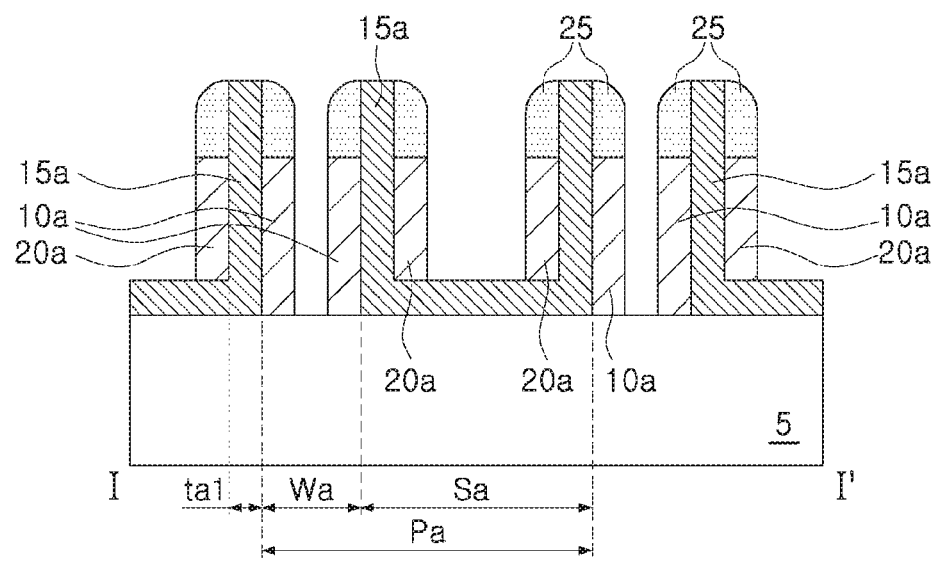

Referring to FIGS. 7 and 8, the first and second sacrificial patterns 10 and 20 may be etched using the upper spacers 25 and the first remaining mask layers 15a as an etch mask. As a result, the first sacrificial patterns 10 may be etched to be formed as first sacrificial spacers 10a, and the second sacrificial patterns 20 may be etched to be formed as second sacrificial spacers 20a.

Figure 9:
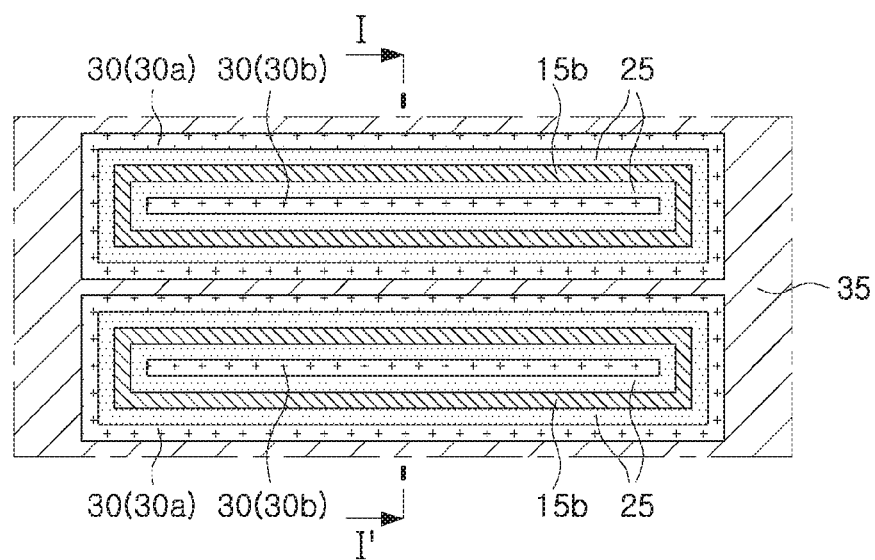
Figure 10A:
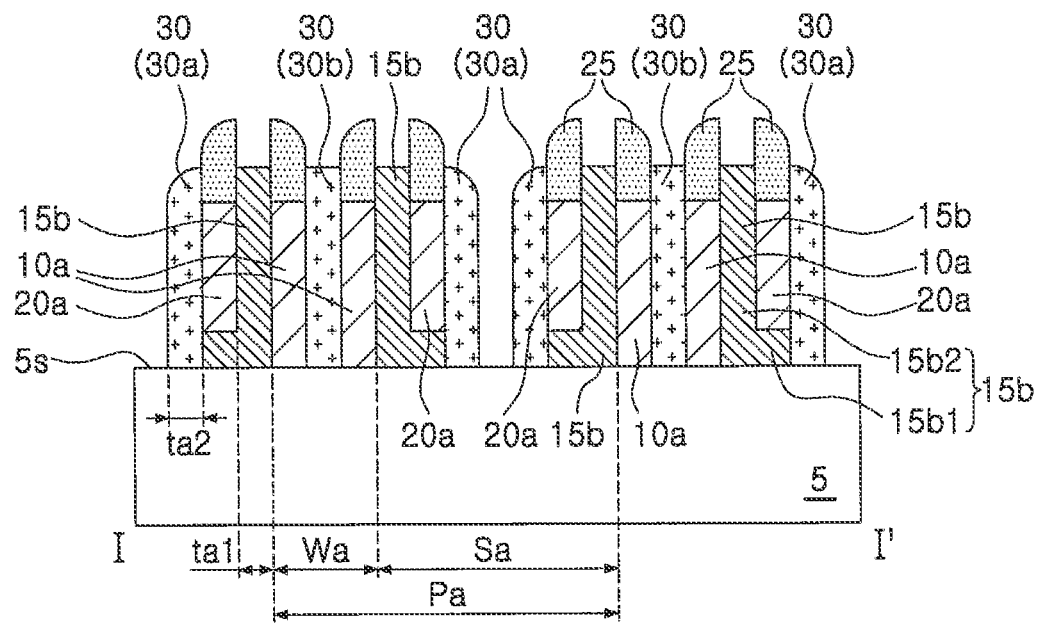

Referring to FIGS. 9 and 10A, the first remaining mask layers 15a may be etched by using the upper spacers 25 as an etch mask. As a result, the first remaining mask layers 15a having a "U" shape may be formed into first remaining mask patterns 15b having an "L" shape.

Each of the first remaining mask patterns 15b may include a horizontal portion 15b1 parallel to an upper surface 5s of the lower structure 5 and a vertical portion 15b2 extending from a portion of the horizontal portion 15b1 in a direction perpendicular to the upper surface 5s of the lower structure 5.

The first sacrificial spacers 10a may be in contact with the lower structure 5. The second sacrificial spacers 20a may be formed on the horizontal portions 15b1 of the first remaining mask patterns 15b. The vertical portions 15b2 of the first remaining mask patterns 15b may be formed between the first and second sacrificial spacers 10a and 20a adjacent to each other.

As described above, each of the first sacrificial patterns 10 may be formed to have the first width Wa. The first sacrificial patterns 10 may be spaced apart from each other by the first distance Sa. Each of the first sacrificial patterns 10 may be formed of two of the first sacrificial spacers 10a, spaced apart from each other, and each of the second sacrificial patterns 20 may be formed of two of the second sacrificial spacers 20a, spaced apart from each other.

Second mask patterns 30 may be formed. Forming the second mask patterns 30 may include performing a deposition process on the lower structure 5, on which the first and second sacrificial spacers 10a and 20a and the first remaining mask patterns 15b have been formed, to conformally form a mask material layer, and anisotropically etching the mask material layer. To form the second mask patterns 30, the first remaining mask patterns 15b are also partially etched while etching the mask material layer, such that the height of the first remaining mask patterns 15b may be lowered.

The second mask patterns 30 may be formed of the same material as that of the first remaining mask patterns 15*b*. The second mask patterns 30 may be formed to have a thickness ta2 equal to a thickness ta1 of the first mask layer 15 as described above with reference to FIGS. 1 and 2.

The second mask patterns 30 may include first patterns 30*a* formed on side surfaces of two second sacrificial spacers 20*a* (which were divided from one second sacrificial pattern 20), and a second pattern 30*b* formed between two first sacrificial spacers 10*a*, divided from one first sacrificial pattern 10.

The first patterns 30*a* of the second mask patterns 30 may be in contact with the horizontal portions 15*b*1 of the first remaining mask patterns 15*b*. The second patterns 30*b* of the second mask patterns 30 may be spaced apart from the first remaining mask patterns 15*b*.

Each of the first patterns 30*a* of the second mask patterns 30 may have an upper surface lowered away or decreasing in height from a portion thereof contacting the second sacrificial spacers 20*a*. Thus, the first patterns 30*a* of the second mask patterns 30 may have an asymmetric side structure, that is, with opposing sidewalls of unequal heights.

The second pattern 30*b* of the second mask patterns 30 may be a gap fill pattern filling between two of the first sacrificial spacers 10*a*, and the second pattern 30*b* may have side surfaces with a symmetrical structure that is, with opposing sidewalls of equal heights.

The vertical portion 15*b*2 of each of the first remaining mask patterns 15*b* may be formed between a pair of the second mask patterns 30.

Figure 10B:
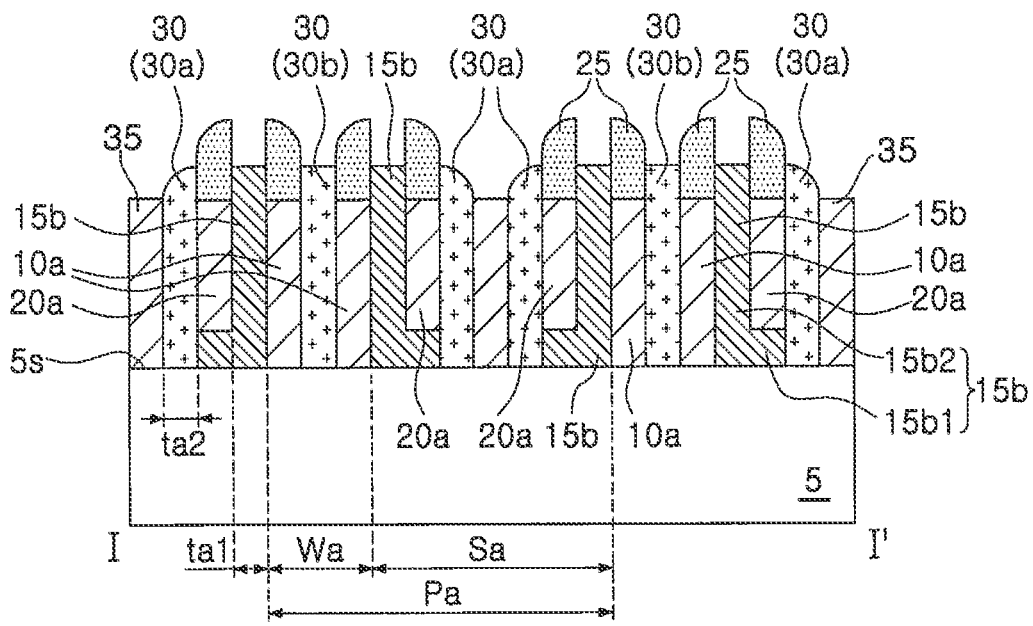

Referring to FIGS. 9 and 10B, a third sacrificial spacer 35 may be formed to fill spaces between the first patterns 30*a* of the second mask patterns 30. Forming the third sacrificial spacer 35 may include forming a sacrificial material layer on the lower structure 5 on which the second mask patterns 30 have been formed, and partially etching the sacrificial material layer to expose the first remaining mask patterns 15*b* and the second mask patterns 30. The third sacrificial spacers 35 may be formed of the same material as that of the first and second sacrificial spacers 10*a* and 20*a*.

Figure 11:
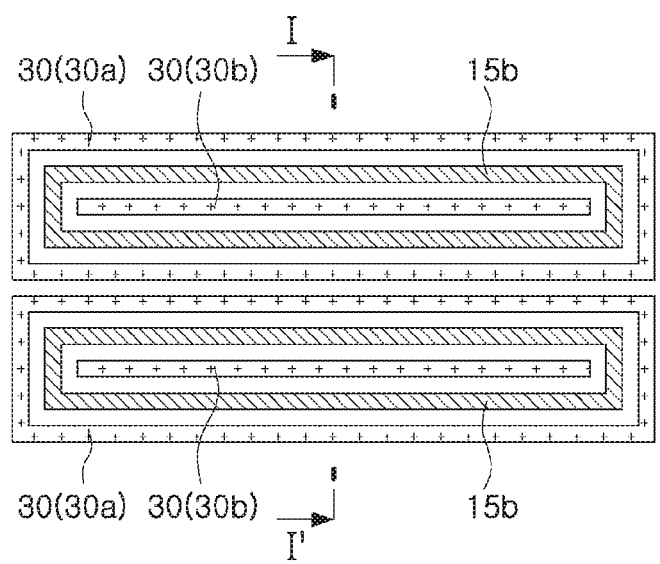
Figure 12A:
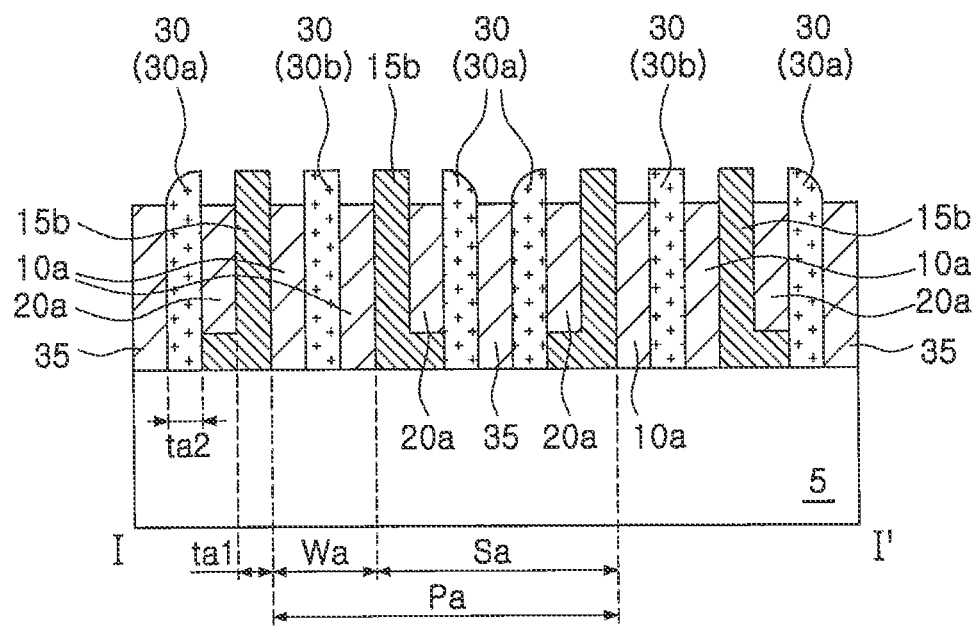

Referring to FIGS. 11 and 12A, the upper spacers 25 may be removed to expose the first and second sacrificial spacers 10*a* and 20*a*. The first, second, and third sacrificial spacers 10*a*, 20*a* and 35 may reduce or prevent the first remaining mask patterns 15*b* and the second mask patterns 30 from collapsing.

Figure 12B:
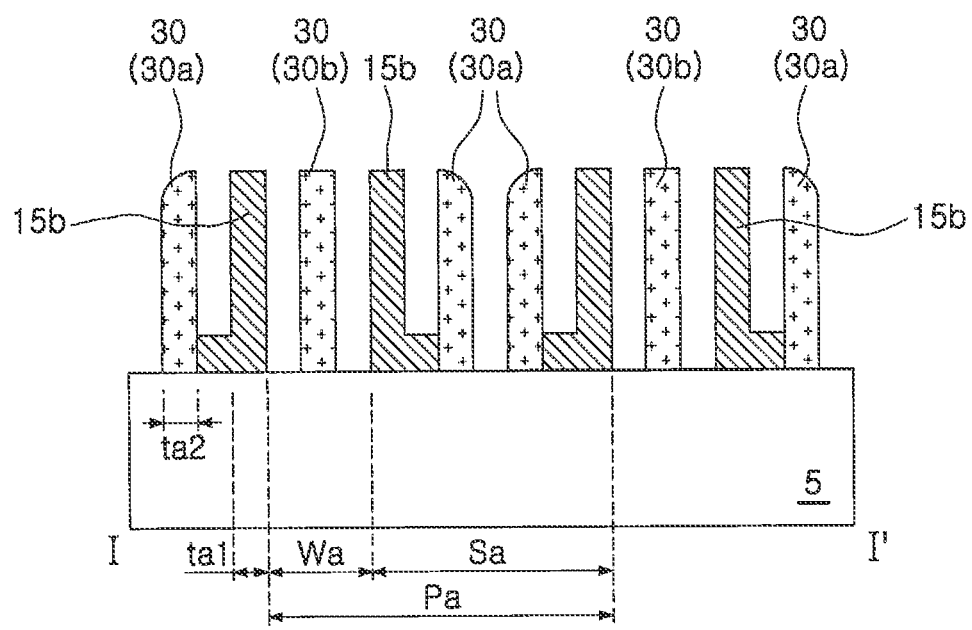

Referring to FIGS. 11 and 12B, the first, second and third sacrificial spacers 10*a*, 20*a* and 35 may be selectively removed. The first remaining mask patterns 15*b* and the second mask patterns 30 may remain.

Figure 13:
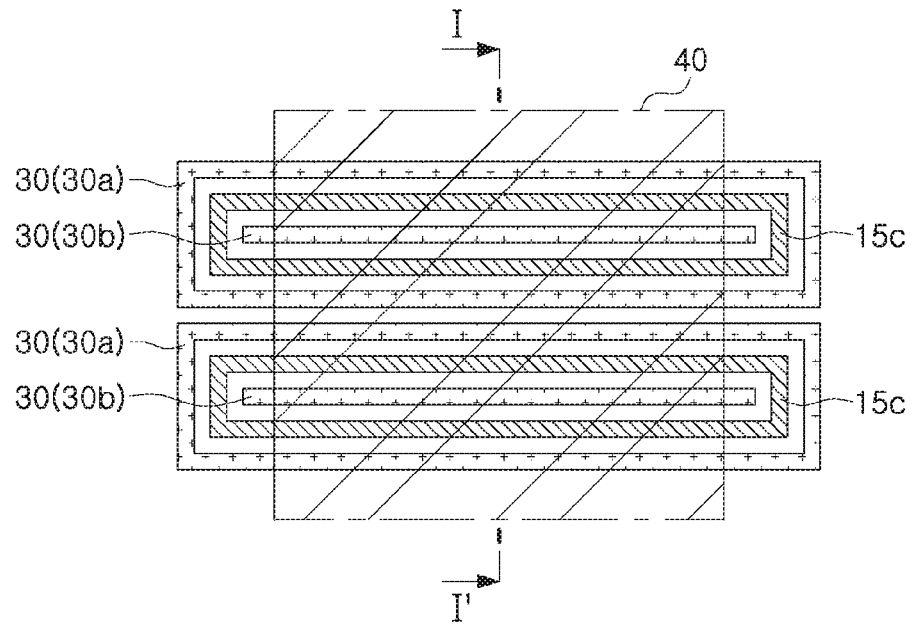
Figure 14:
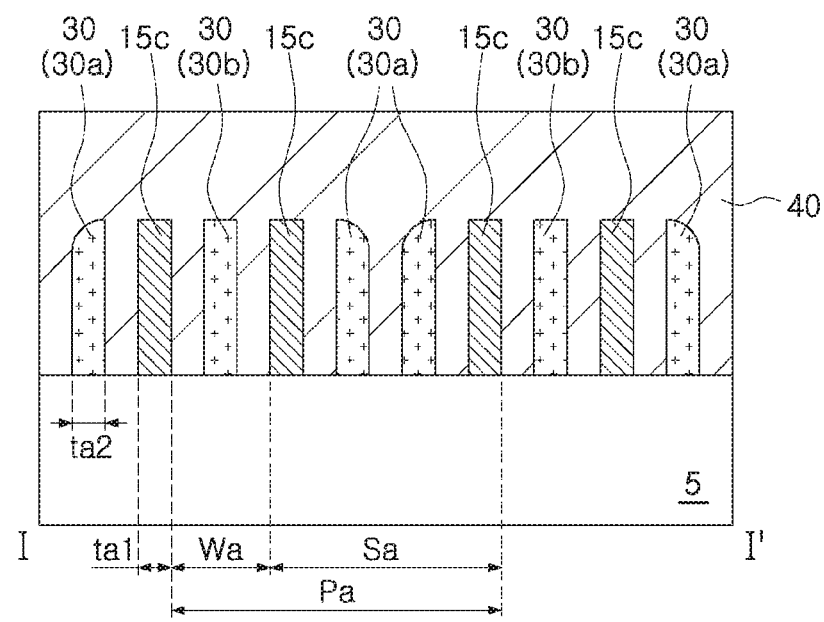

Referring to FIGS. 13 and 14, the first remaining mask patterns 15*b* and the second mask patterns 30 may be anisotropically etched. As a result, the first remaining mask patterns 15*b* having an "L" shape may be lowered or reduced in height to be formed into first mask patterns 15*c* having an "I" shape. The second mask patterns 30 having an "I" shape may be lowered or reduced in height. Thus, the first and second mask patterns 15*c* and 30 may be formed to have an "I" shape. A trim pattern 40 may be formed to expose edge regions of the first and second mask patterns 15*c* and 30.

Figure 15:
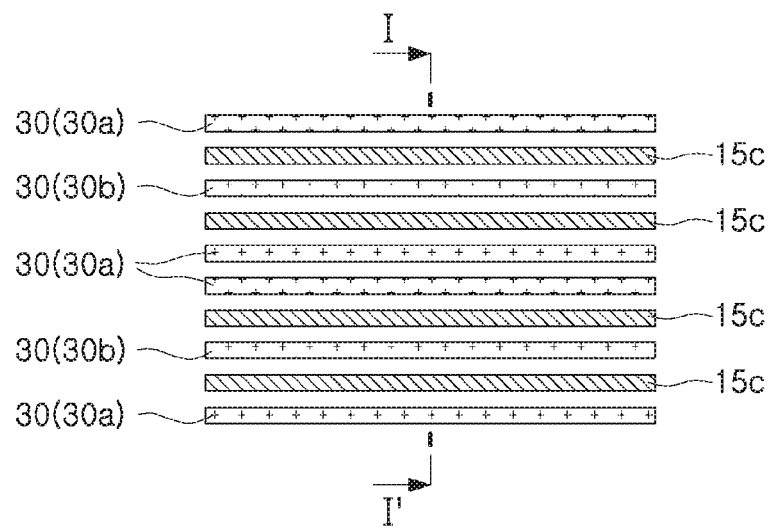
Figure 16:
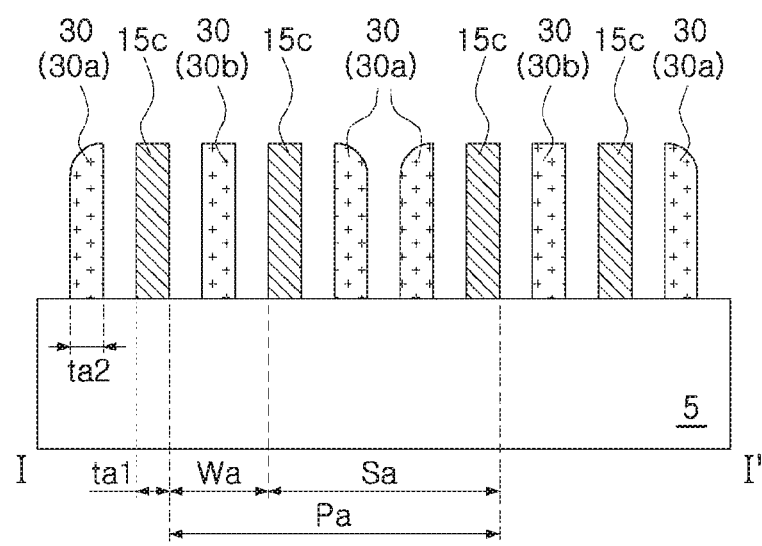

Referring to FIGS. 15 and 16, the edge regions of the first and second mask patterns 15*c* and 30 may be etched by using the trim pattern 40 (see FIGS. 13 and 14) as an etch mask, in such a manner that the first and second mask patterns 15*c* and 30 may be formed to have a linear shape or a bar shape. In an illustrative example, the trim pattern 40 (see FIGS. 13 and 14) may be a photoresist pattern. Alternatively, the trim pattern 40 (see FIGS. 13 and 14) may be a sacrificial pattern patterned by a photolithographic process. Subsequently, the trim pattern 40 (see FIGS. 13 and 14) may be removed.

Figure 17A:
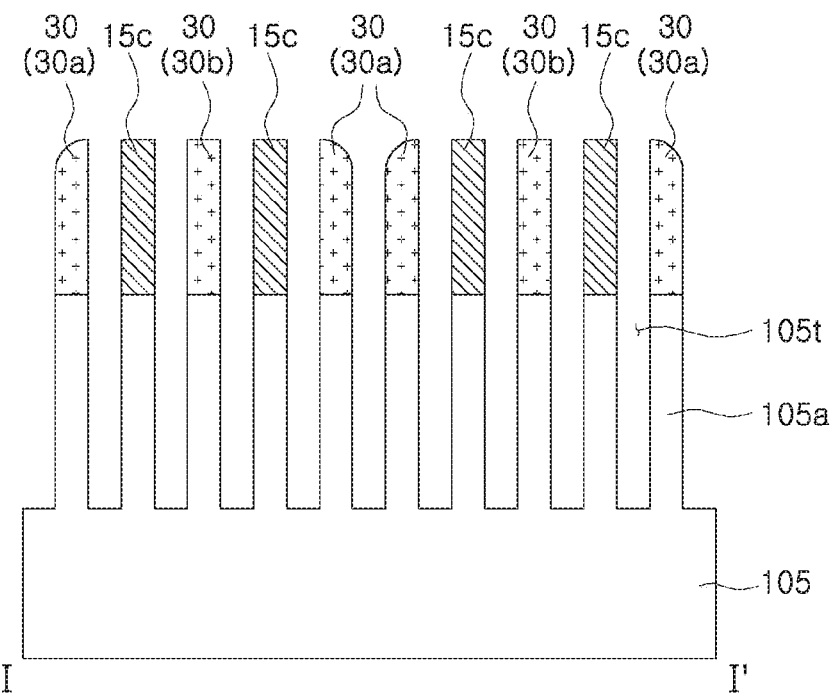
FIGS. 17A and 17B are cross-sectional views illustrating an example of methods of forming a semiconductor device according to some embodiments of the present inventive concepts.
Figure 17B:
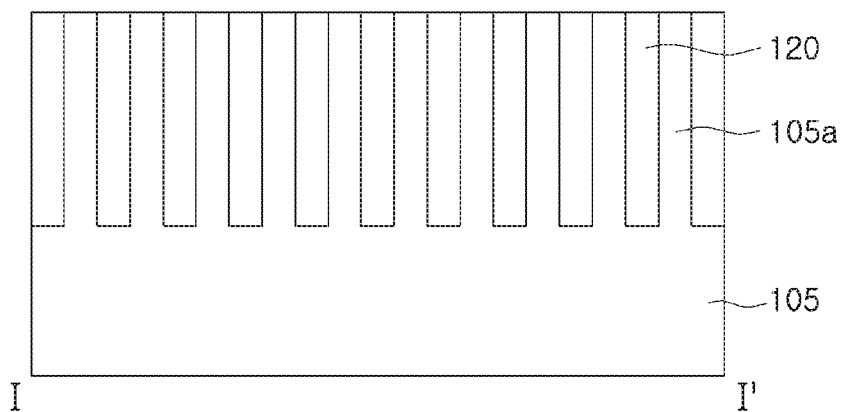

As described above, the first and second mask patterns 15*c* and 30 having the form of a line or a bar may be provided. Next, methods of forming a semiconductor device using the first and second mask patterns 15*c* and 30 will be described below. FIGS. 17A and 17B are cross-sectional views illustrating an example of methods of forming a semiconductor device according to an embodiment.

Referring to FIG. 17A, the lower structure 5 described above with reference to FIGS. 1 to 16 may be a lower structure 105 such as a semiconductor substrate or the like. The first and second mask patterns 15*c* and 30 as described above may be formed on the lower structure 105. Trenches 105*t* may be formed by etching the lower structure 105 by using the first and second mask patterns 15*c* and 30 as an etch mask.

In an example, when the lower structure 105 is a semiconductor substrate, portions 105*a* of the semiconductor substrate 105 remaining below the first and second mask patterns 15*c* and 30, provided while the trenches 105*t* are formed, may be active regions. Thus, the portions 105*a* of the semiconductor substrate 105 defined by the trenches 105*t*, for example, the active regions, may be formed.

Referring to FIG. 17B, gap fill patterns 120 may be formed to fill the trenches 105*t*. Forming the gap fill patterns 120 may include forming a gap fill material layer on the semiconductor substrate 105 on which the trenches 105*t* have been formed, and planarizing the gap fill material layer. The first and second mask patterns 15*c* and 30 may be removed while planarizing the gap fill material layer or after planarizing the gap fill material layer. Thus, the gap fill patterns 120 remaining in the trenches 105*t* may be formed.

In an example, when the portions 105*a* of the semiconductor substrate 105 defined by the trenches 105*t* are active regions, the gap fill patterns 120 may be isolation regions that may be formed of an insulating material such as silicon oxide or the like. The first and second mask patterns 15*c* and 30 may be removed while forming the isolation regions 120 or after forming the isolation regions 120.

Figure 18A:
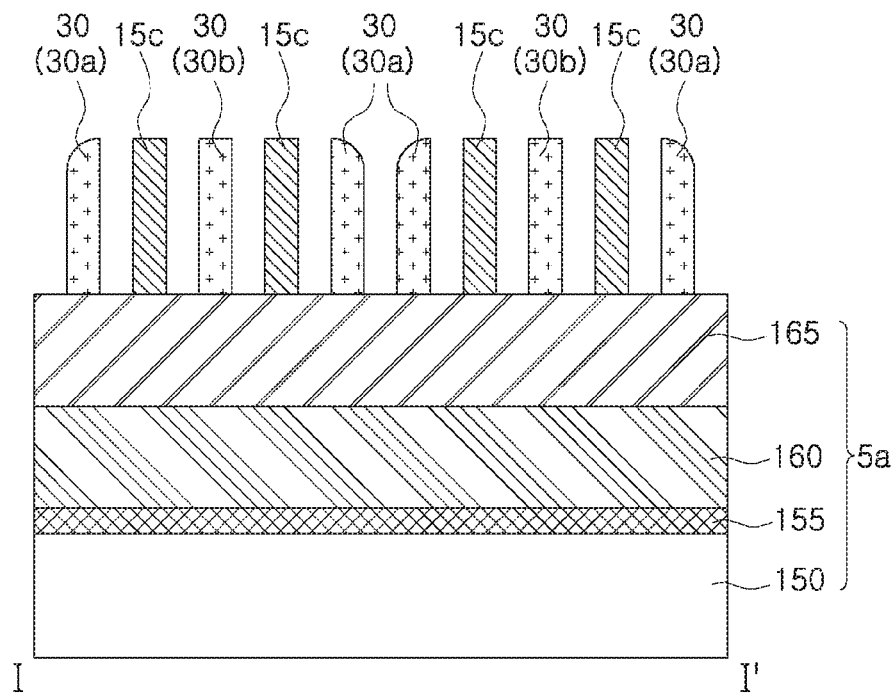
FIGS. 18A to 18C are cross-sectional views illustrating an example of methods of forming a semiconductor device according to some embodiments of the present inventive concepts.
Figure 18B:
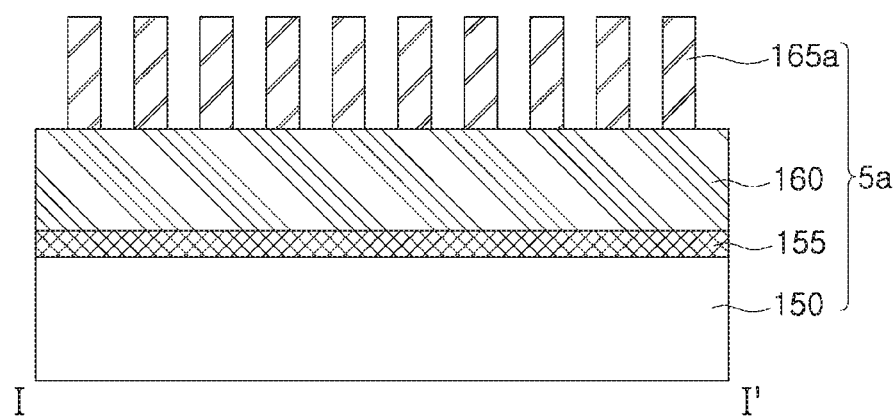
Figure 18C:
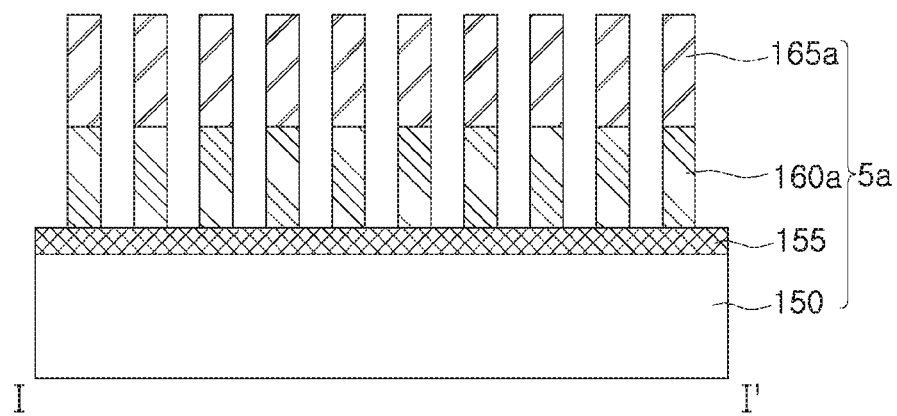

FIGS. 18A to 18C are cross-sectional views illustrating another example of methods of forming a semiconductor device according to some embodiments.

Referring to FIG. 18A, the lower structure 5 described above with reference to FIGS. 1 to 16 may be a lower structure 5*a* including a semiconductor substrate 150, an insulating layer 155 on the semiconductor substrate 150, a conductive layer 160 on the insulating layer 155, and a capping insulating layer 165 on the conductive layer 160. The capping insulating layer 165 may be formed of a material having etch selectivity with the first and second mask patterns 15*c* and 30, for example, formed of silicon nitride. The conductive layer 160 may be formed of a conductive material that may be used as a gate electrode of a semiconductor device or a conductive material that may be used as a wiring of a semiconductor device. For example, the conductive layer 160 may be formed of a polysilicon layer, a metal nitride layer such as a TiN or TaN layer, or a metal such as tungsten (W), copper (Cu) or the like, or combinations thereof.

The first and second mask patterns 15*c* and 30 described above with reference to FIGS. 1 to 16 may be formed on the lower structure 5*a*.

Referring to FIG. 18B, the capping insulating layer 165 of the lower structure 5a may be etched by using the first and second mask patterns 15c and 30 as an etch mask, to form capping insulating patterns 165a.

In an example, the first and second mask patterns 15c and 30 may be etched and removed while forming the capping insulating patterns 165a, but some embodiments thereof is not limited thereto. For example, the first and second mask patterns 15c and 30 may remain after forming the capping insulating patterns 165a.

Referring to FIG. 18C, conductive patterns 160a may be formed by etching the conductive layer 160, using the capping insulating patterns 165a as an etch mask. Thus, the lower structure 5a may include the conductive patterns 160a and the capping insulating patterns 165a, which may be formed by patterning using the first and second mask patterns 15c and 30 to then be sequentially stacked.

In an example, the conductive patterns 160a may be gate electrodes of a semiconductor device.

In an illustrative example, the conductive patterns 160a may be wirings of a semiconductor device.

In an illustrative example, the conductive patterns 160a may be bit lines of a memory semiconductor device such as a dynamic random access memory (DRAM) or the like.

Figure 19:
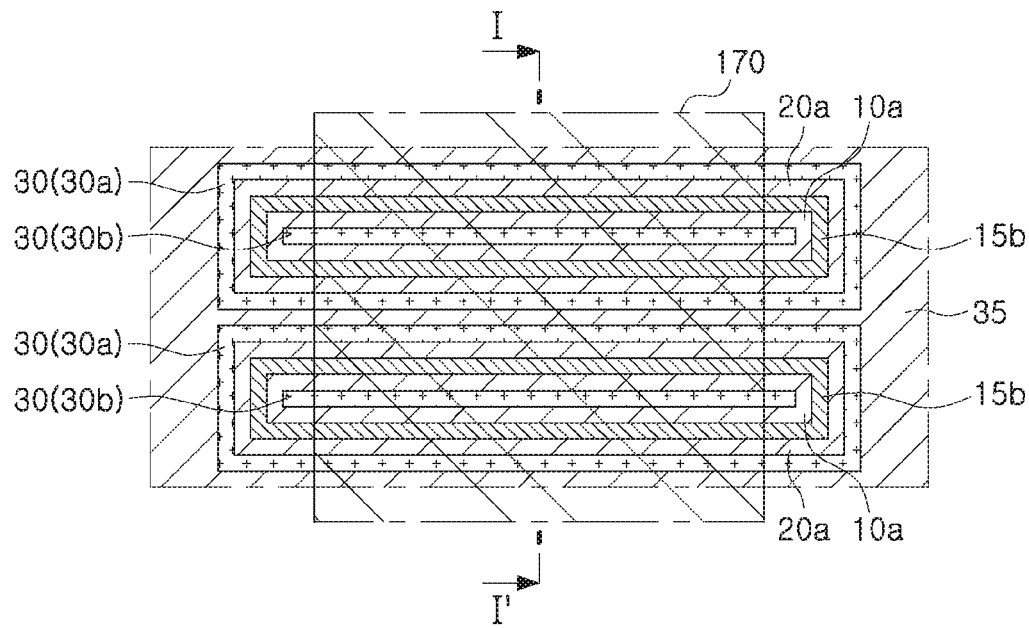
FIGS. 19 to 21 are views illustrating an example of methods of forming a semiconductor device according to some embodiments of the present inventive concepts.
Figure 20:
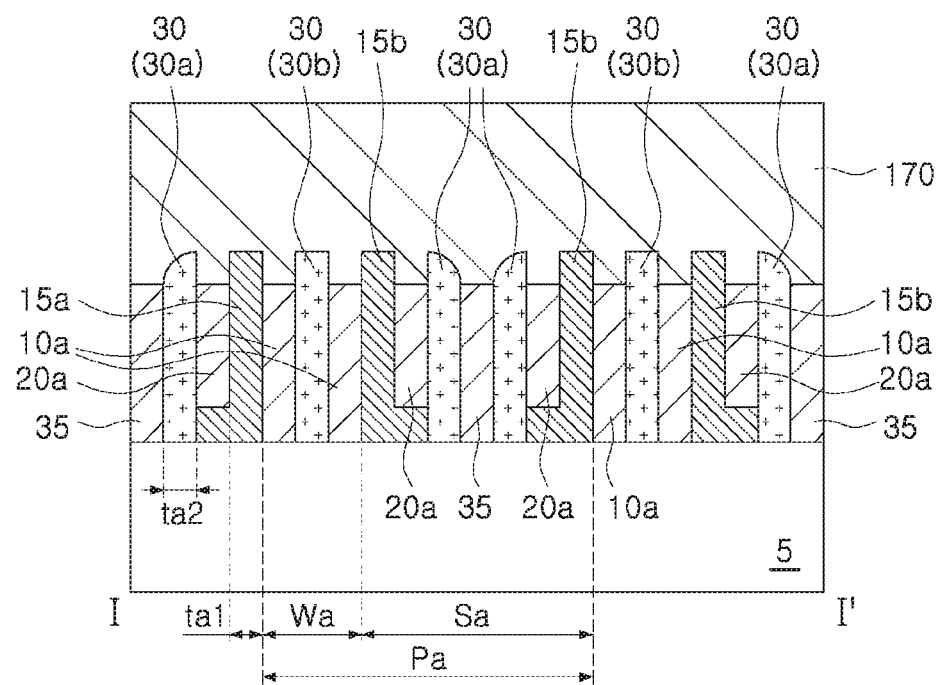
Figure 21:
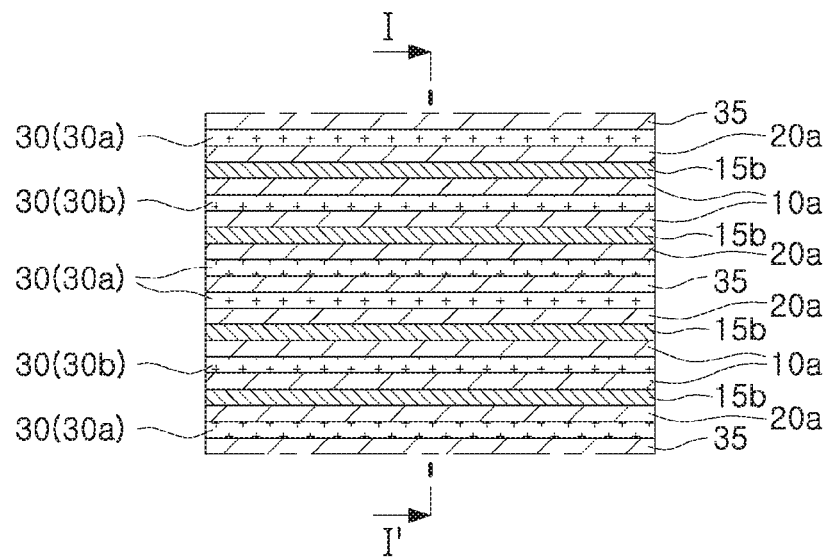

Referring again to FIGS. 13 and 14, as described above, to form the first and second mask patterns 15c and 30 having a linear shape or a bar shape, the trim pattern (40 in FIGS. 13 and 14) may be formed to cut portions of the first and second mask patterns 15c and 30. The trim pattern 40 may be formed after the first and second mask patterns 15c and 30 are formed, but some embodiments thereof is not limited thereto. Hereinafter, an example in which an operation of forming the trim pattern (40 in FIGS. 13 and 14) is modified will be described with reference to FIGS. 19, 20 and 21. FIG. 19 is a plan view illustrating the cross-sectional structure of FIG. 12A described above while further including a trim pattern 170. FIG. 20 is a cross-sectional view illustrating a region taken along line I-I' of FIG. 19. FIG. 21 is a plan view illustrating a planar shape of a patterned structure using the trim pattern 170 in the plan view of FIG. 19.

Referring to FIGS. 19 and 20, the trim pattern 170 may be formed on the lower structure 5 including the first through third sacrificial spacers 10a, 20a and 35. The trim pattern 170 may be formed of a photoresist pattern.

Referring to FIGS. 21 and 12A, the first to third sacrificial spacers 10a, 20a and 35, the first remaining mask patterns 15b, and the second mask patterns 30 may be etched, by using the trim pattern 170 as an etch mask, and then the trim pattern 170 may be removed. Subsequently, the first to third sacrificial spacers 10a, 20a and 35 may be removed.

On such a resultant product, the first remaining mask patterns 15b and the second mask patterns 30 are subjected to anisotropic etching, to form the first and second mask patterns 15c and 30 having an "I" shape the same as that described with reference to FIGS. 15 and 16.

Next, a modified example of the semiconductor device forming method according to some embodiments will be described with reference to FIGS. 22 to 33. In FIGS. 22 to 33, FIGS. 22, 24, 26, 28, 30 and 32 are plan views illustrating an example of methods of forming a semiconductor device according to some embodiments, and FIGS. 23, 25A, 25B, 25C, 27, 29A, 29B, 31A, 31B and 33 are cross-sectional views taken along line II-IF of the plan views of FIGS. 22, 24, 26, 28, 30 and 32.

Figure 22:
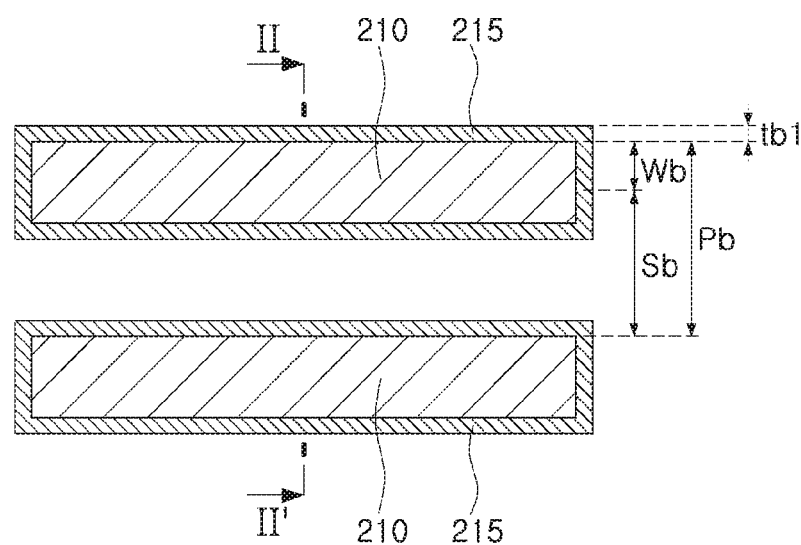
FIGS. 22 to 33 are views illustrating an example of methods of forming a semiconductor device according to some embodiments of the present inventive concepts.
Figure 23:
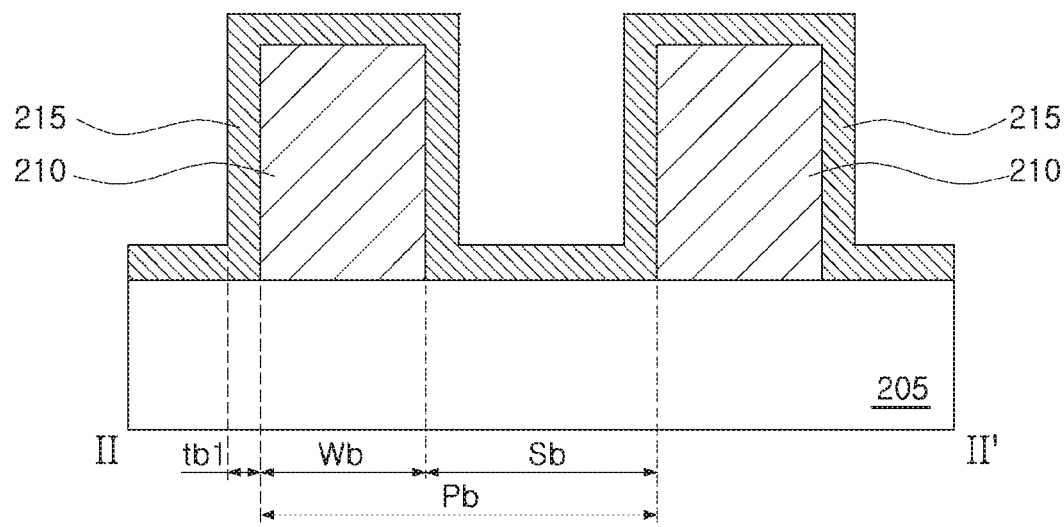

Referring to FIGS. 22 and 23, first sacrificial patterns 210 may be formed on a lower structure 205. The first sacrificial patterns 210 may be respectively formed to have a linear shape. The first sacrificial patterns 210 may be formed of a spin on hardmask (SOH) material. For example, the first sacrificial patterns 210 may be formed of a carbon-containing material. Forming the first sacrificial patterns 210 may include forming a sacrificial material layer on the lower structure 205 and patterning the sacrificial material layer using a photolithography process.

A first mask layer 215 may be conformally formed on the lower structure 205 having the first sacrificial patterns 210. For example, the first mask layer 215 may extend on or cover upper surfaces and side surfaces of the respective first sacrificial patterns 210, and portions of the lower structure 205 between the first sacrificial patterns 210. In an example, the first mask layer 215 may be formed of the same material as that of the first mask layer (15 in FIGS. 1 and 2) described with reference to FIGS. 1 and 2.

The first sacrificial patterns 210 may be formed at a first pitch Pb. Each of the first sacrificial patterns 210 may have a first width Wb. The first sacrificial patterns 210 may be spaced apart from each other by a first distance Sb. The ratio of the first width Wb to the first distance Sb may be about 5 to 7. A sum of the first width Wb and the first distance Sb may be the first pitch Pb. A first thickness tb1 of the first mask layer 215 may be about one-fifth of the first width Wb.

Figure 24:
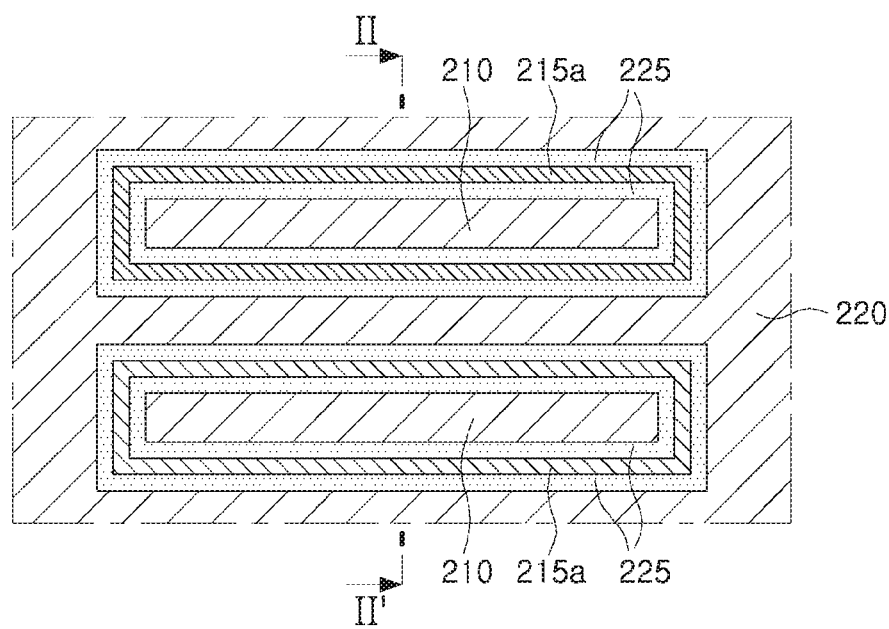
Figure 25A:
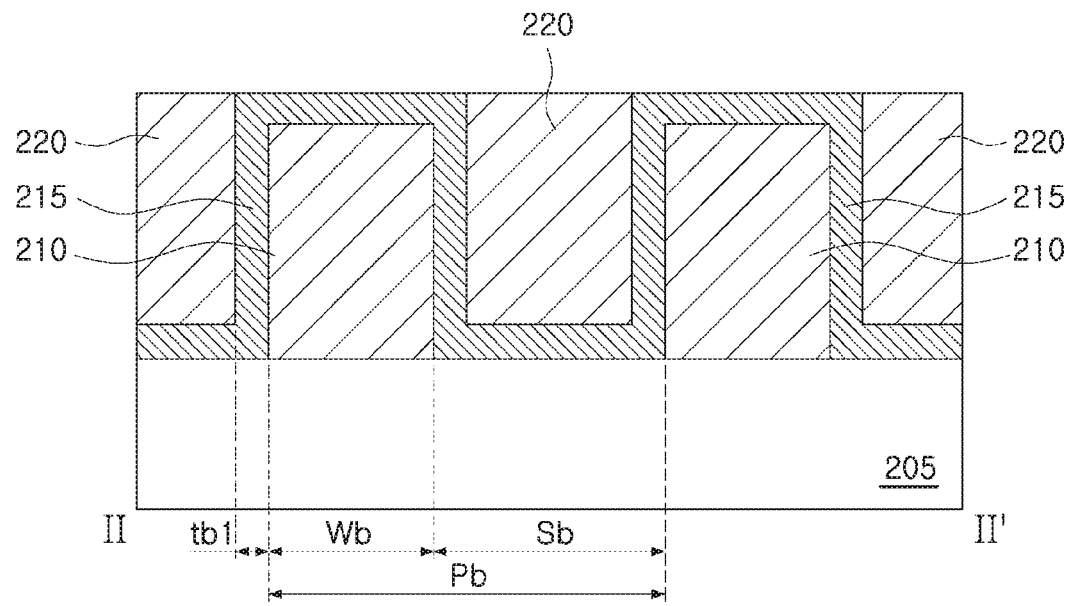

Referring to FIGS. 24 and 25A, second sacrificial patterns 220 may be formed on the first mask layer 215 to fill spaces between the first sacrificial patterns 210. Forming the second sacrificial patterns 220 may include forming a sacrificial material layer on the first mask layer 215 and etching the sacrificial material layer until the first mask layer 215 located on the first sacrificial patterns 210 is exposed.

Figure 25B:
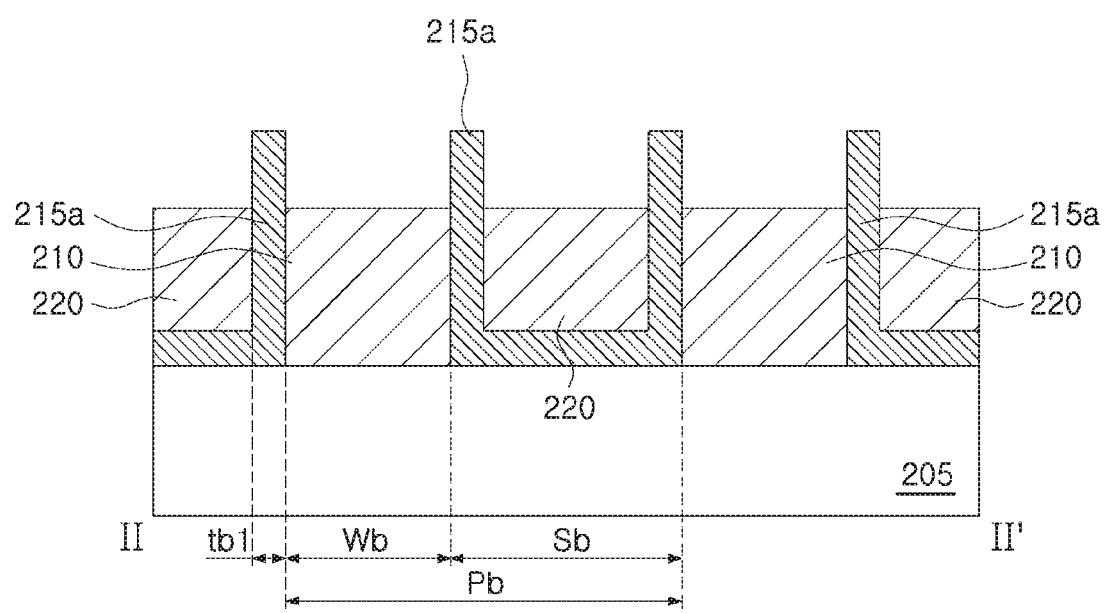

Referring to FIGS. 24 and 25B, portions of the first mask layer 215 located on the first sacrificial patterns 210 may be removed to expose upper surfaces of the first sacrificial patterns 210. The first mask layer 215 may be formed into first remaining mask layers 215a located between the first sacrificial patterns 210 and located below the second sacrificial patterns 220.

A process of lowering or reducing heights of the first and second sacrificial patterns 210 and 220 may be performed. For example, a capping layer (22 in FIG. 4B) may be formed to extend on or cover the first and second sacrificial patterns 210 and 220, in the same or similar manner as that described with reference to FIG. 4B, and the capping layer (22 in FIG. 4B) and the first and second sacrificial patterns 210 and 220 may be sequentially etched to form the first and second sacrificial patterns 210 and 220 having a reduced height in the same or similar manner as that described with reference to FIG. 4C, thereby exposing upper regions of the first remaining mask layers 215a.

Figure 25C:
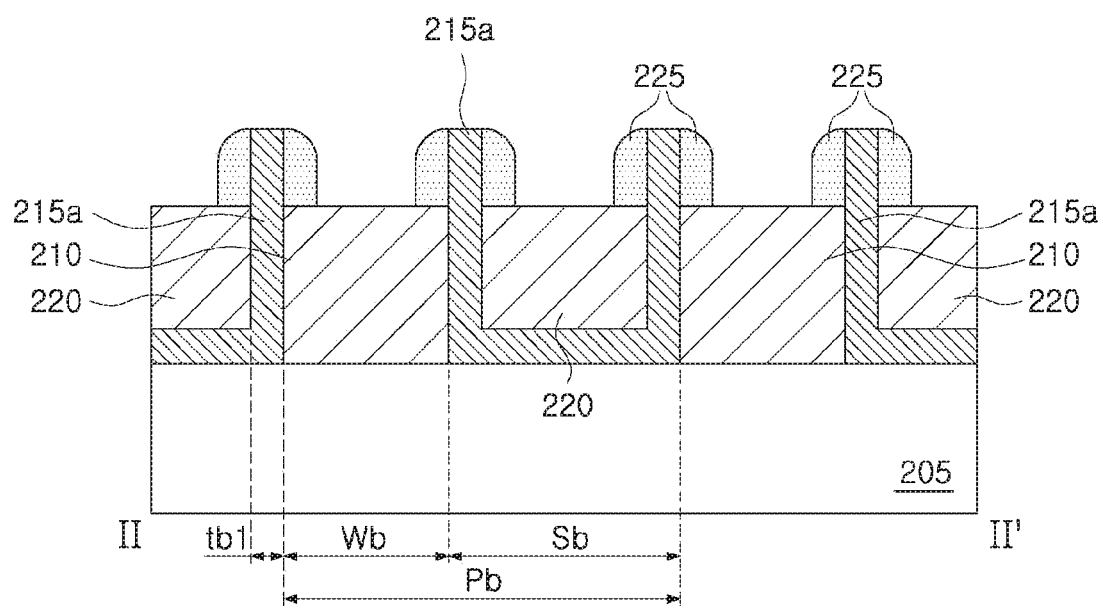

Referring to FIGS. 24 and 25C, subsequently, upper spacers 225 may be formed on side surfaces of the upper regions of the first remaining mask layers 215a, in the same or similar manner as described with reference to upper spacers 25 in FIG. 6. The upper spacers 225 may be formed on the first and second sacrificial patterns 210 and 220, and may extend on or cover the side surfaces of the upper regions of the first remaining mask layers 215a.

Figure 26:
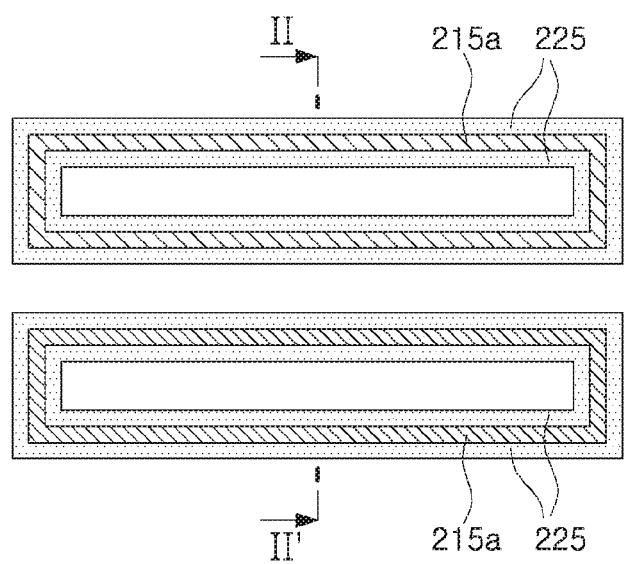
Figure 27:
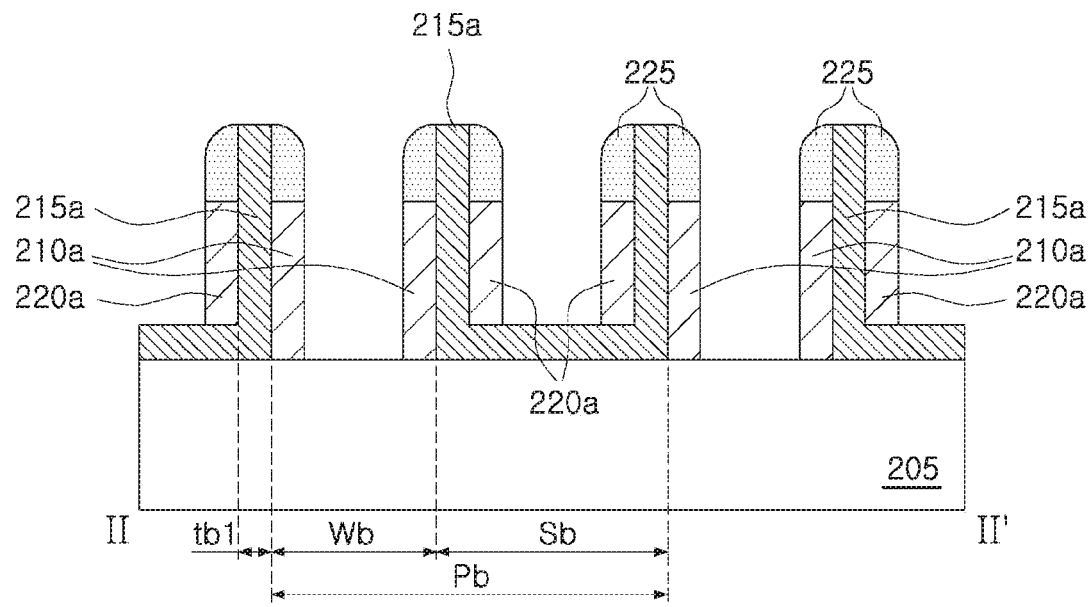

Referring to FIGS. 26 and 27, subsequently, the first and second sacrificial patterns 210 and 220 may be etched by using the upper spacers 225 and the first remaining mask layers 215a as an etch mask. Each of the first sacrificial patterns 210 may be etched and formed into two first sacrificial spacers 210a spaced apart from each other, and each of the second sacrificial patterns 220 may be etched and formed into two second sacrificial spacers 220a spaced apart from each other.

Figure 28:
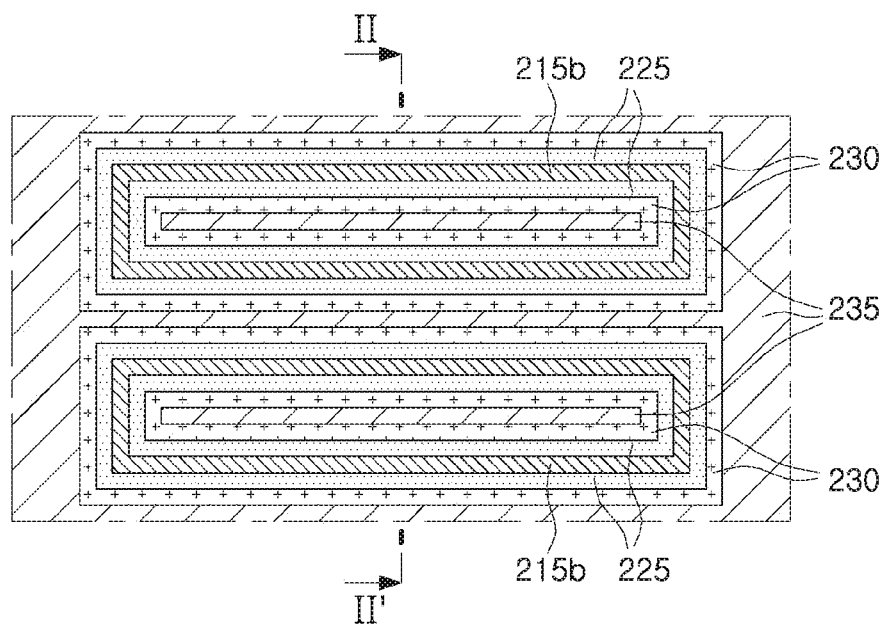
Figure 29A:
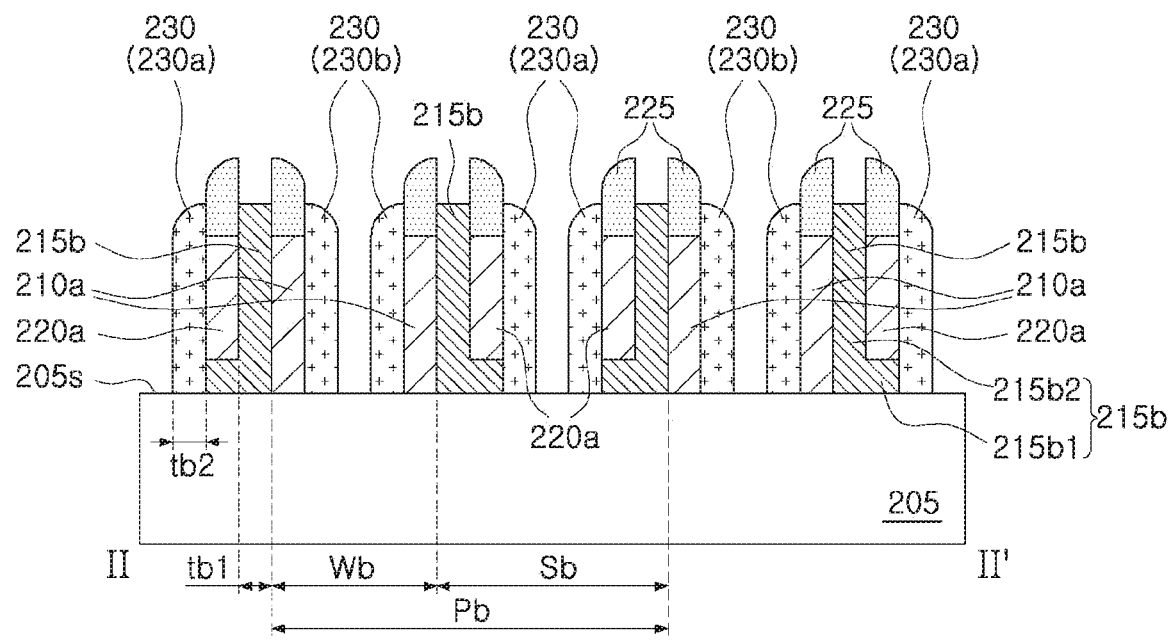

Referring to FIGS. 28 and 29A, the first remaining mask layers 215a may be etched using the upper spacers 225 as an etch mask, in a manner similar to that described with reference to FIG. 10A. As a result, the first remaining mask layers 215a having a "U" shape may be formed into first remaining mask patterns 215b having an "L" shape.

Each of the first remaining mask patterns 215b may include a horizontal portion 215b1 parallel to an upper surface 205s of the lower structure 205 and a vertical portion 215b2 extending from a portion of the horizontal portion 215b1 in a direction perpendicular to the upper surface 205s of the lower structure 205.

Second mask patterns 230 may be formed. Forming the second mask patterns 230 may include performing a deposition process on the lower structure 205 on which the first and second sacrificial spacers 210a and 220a and the first remaining mask patterns 215b have been formed, to conformally form a mask material layer, and anisotropically etching the mask material layer. To form the second mask patterns 230, the first remaining mask patterns 215b are partially etched together with etching the mask material layer, such that the height of the first remaining mask patterns 215b may be lowered.

The second mask patterns 230 may be formed of the same material as that of the first remaining mask patterns 215b. The second mask patterns 230 may be formed to have the same thickness tb2 as a thickness tb1 of the first mask layer 215 as described above with reference to FIGS. 22 and 23.

Each of the second mask patterns 230 may have an upper surface that is lowered away or decreasing in height from a portion thereof contacting the first and second sacrificial spacers 210a and 220a. Thus, the second mask patterns 230 may have an asymmetric lateral structure that is, with opposing sidewalls of unequal heights.

The second mask patterns 230 may include a first pattern 230a formed on side surfaces of two of the second sacrificial spacers 220a, divided from one second sacrificial pattern 220, and a second pattern 230b formed between two of the first sacrificial spacers 210a, divided from one of the first sacrificial patterns 210.

The first pattern 230a of the second mask patterns 230 may be in contact with the horizontal portions 215b1 of the first remaining mask patterns 215b, and the second patterns 230b of the second mask patterns 230 may be spaced apart from the first remaining mask patterns 215b.

Figure 29B:
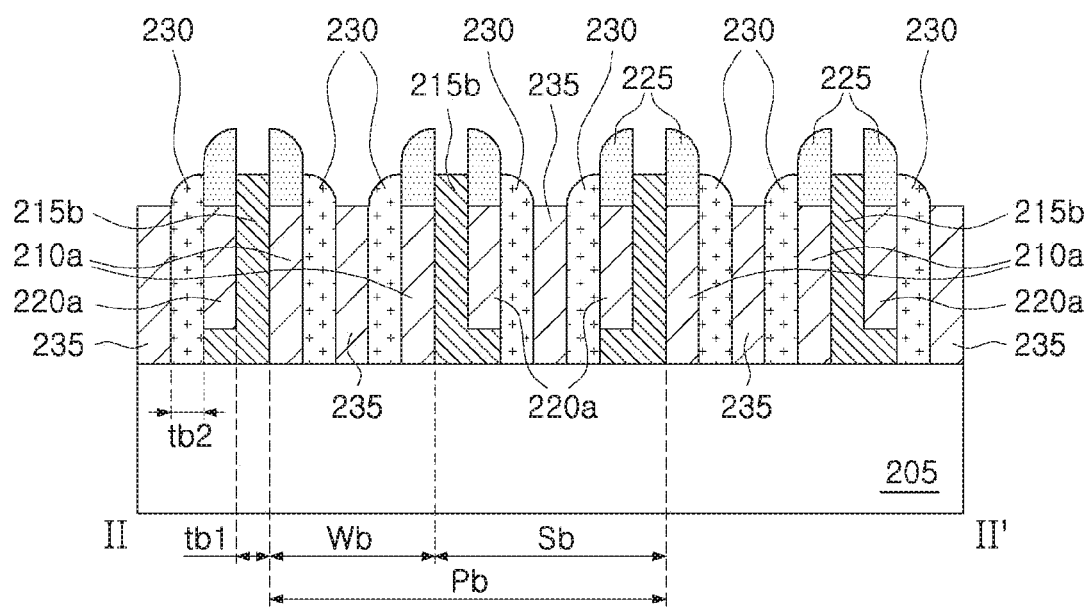

Referring to FIGS. 28 and 29B, third sacrificial spacers 235 may be formed to fill spaces between the second mask patterns 230. The third sacrificial spacers 235 may be formed of the same material as that of the first and second sacrificial spacers 210a and 220a.

Figure 30:
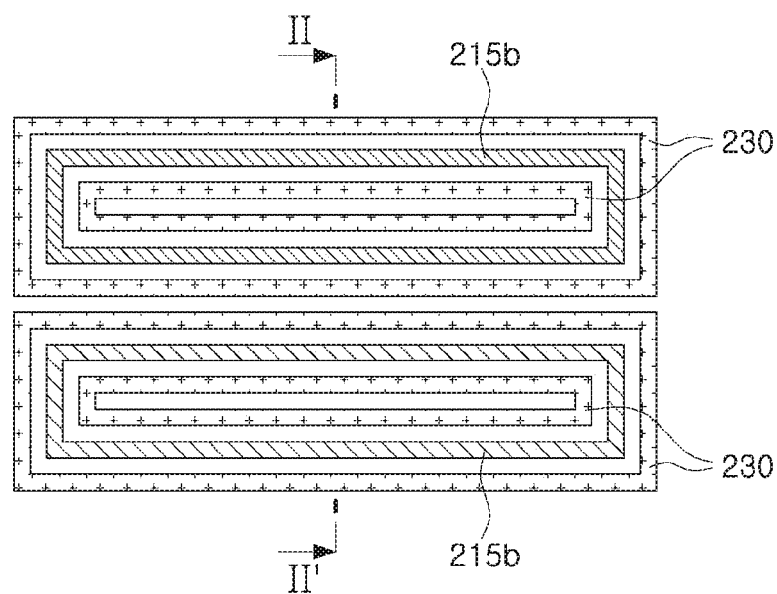
Figure 31A:
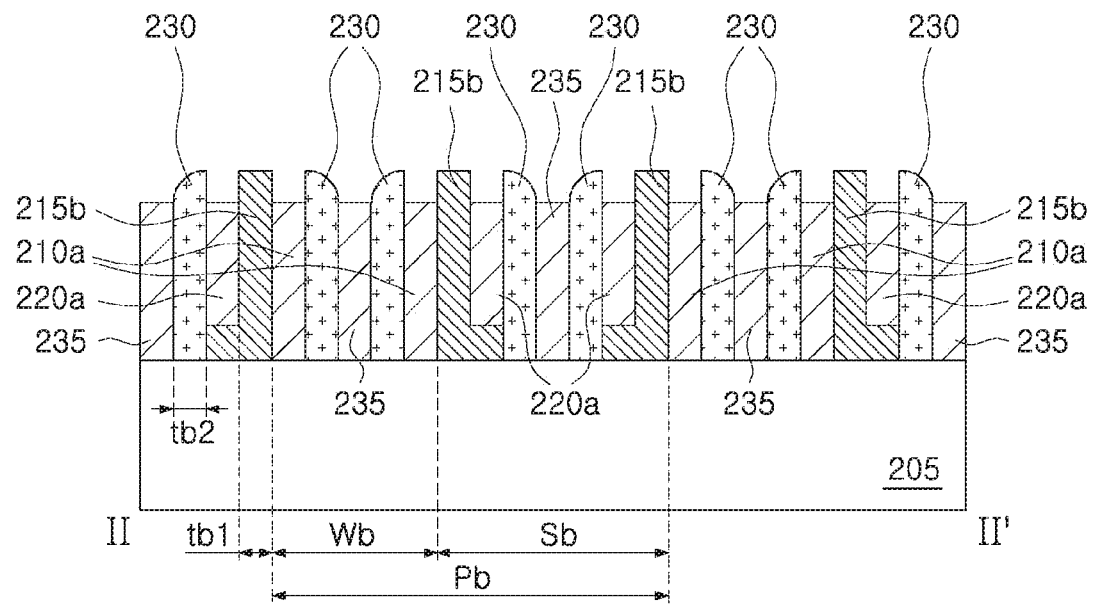

Referring to FIGS. 30 and 31A, the upper spacers 225 may be removed to expose the first and second sacrificial spacers 210a and 220a.

Figure 31B:
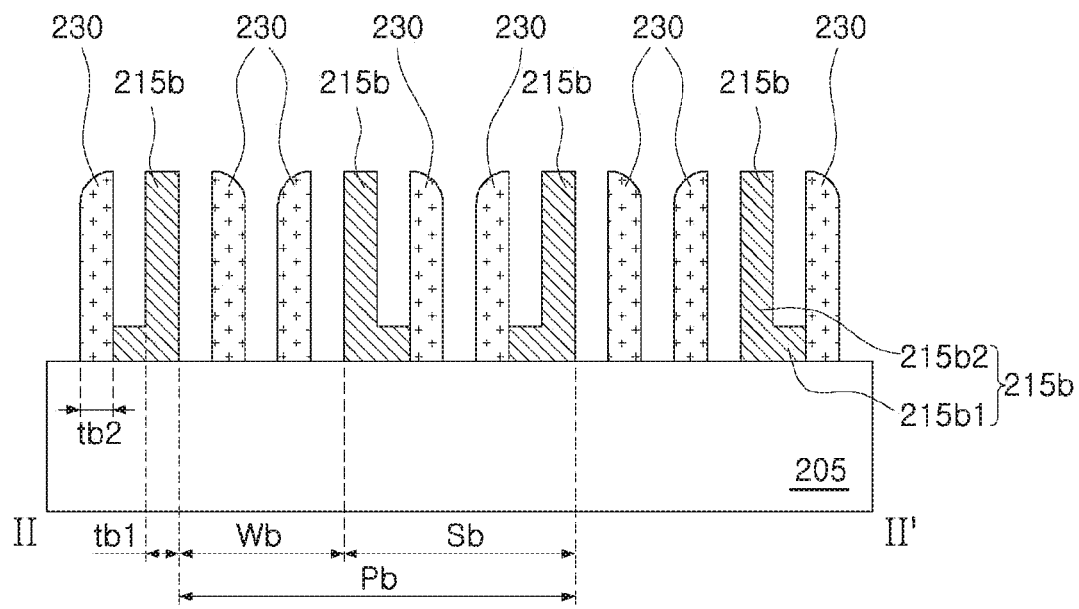

Referring to FIGS. 30 and 31B, the first, second and third sacrificial spacers 210a, 220a and 235 may be removed.

Figure 32:
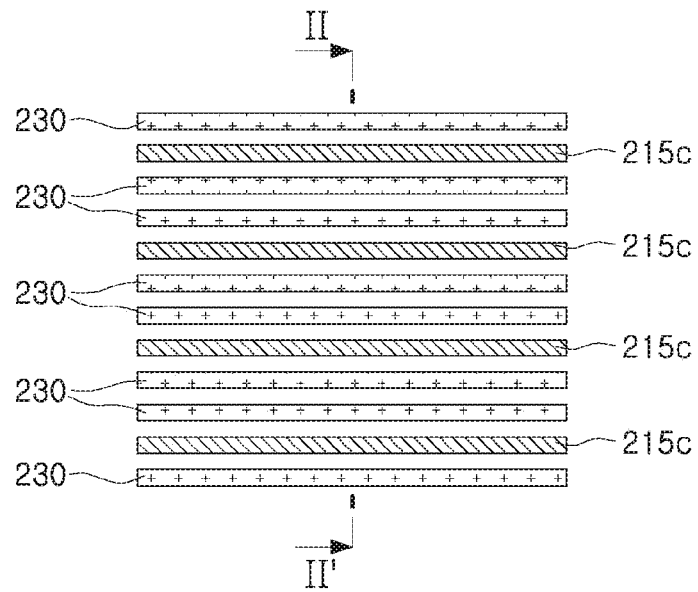
Figure 33:
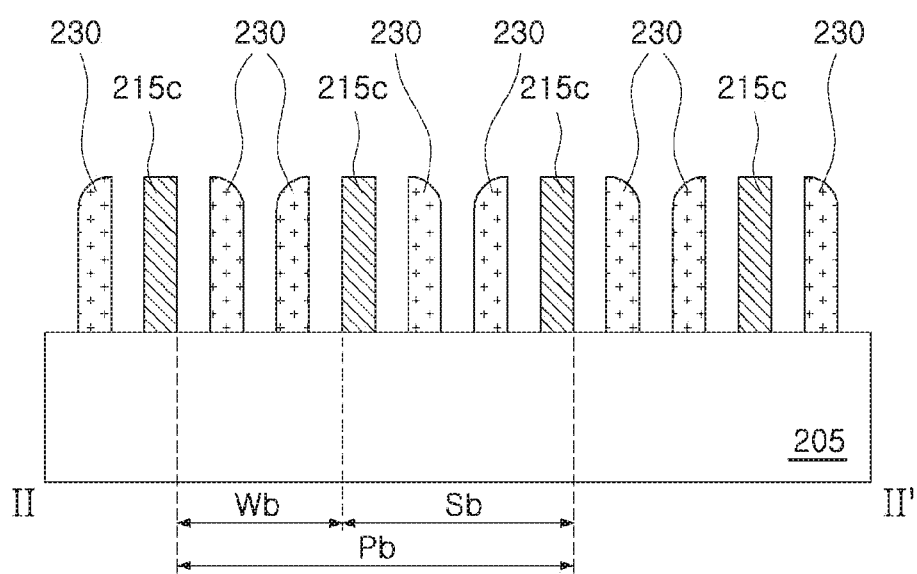

Referring to FIGS. 32 and 33, the first remaining mask patterns 215b and the second mask patterns 230 may be anisotropically etched. As a result, the first remaining mask patterns 215b having an "L" shape may be lowered or reduced in height and formed into first mask patterns 215c having an "I" shape. The second mask patterns 230 having the "I" shape may be lowered or reduced in height. Thus, the first and second mask patterns 215c and 230 may have the "I" shape with a constant or uniform width.

In some embodiments, the first and second mask patterns 215c and 230 may be patterned using the trim pattern 40 as described with reference to FIGS. 13 and 14. Thus, the first and second mask patterns 215c and 230 may be formed to have a linear shape or a bar shape.

In an example, methods of forming a semiconductor device according to some embodiments may include forming the first sacrificial patterns 10 or 210 on the lower structure 5 or 205, forming the first remaining mask layers 15a or 215a having a "U" shape and in contact with the first sacrificial patterns 10 or 210, to be disposed between the first sacrificial patterns 10 or 210, patterning the first remaining mask layers 15a or 215a to form the first remaining mask patterns 15b or 215b including the horizontal portions 15b1 or 215b1 parallel to the upper surface of the lower structure 5 or 205 and the vertical portions 15b2 or 215b2 perpendicular to the upper surface of the lower structure 5 or 205, forming the second mask patterns 30 or 230 spaced apart from the vertical portions 15b2 or 215b2 of the first remaining mask patterns 15b or 215b, removing remaining first sacrificial patterns 10 or 210, and etching the horizontal portions 15b1 or 215b1 of the first remaining mask patterns 15b or 215b to form the first mask patterns 15c or 215c.

In an example, methods of forming a semiconductor device according to some embodiments may include forming the first remaining mask patterns 15b or 215b including the horizontal portions 15b1 or 215b1 parallel to the upper surface of the lower structure 5 or 205 and the vertical portions 15b2 or 215b2 extending from portions of the horizontal portions 15b1 or 215b1 in a direction perpendicular to the upper surface of the lower structures 5 or 205, on the lower structure 5 or 205, forming the second mask patterns 30 or 230 on the lower structure 5 or 205, and anisotropically etching the first remaining mask patterns 15b or 215b and the second mask patterns 30 and 230. The horizontal portions 15b1 or 215b1 of the first remaining mask patterns 15b or 215b may be etched by the anisotropic etching to be formed into the first mask patterns 15c or 215c. The second mask patterns 30 or 230 may be formed of first patterns 30a or 230a contacting the horizontal portions 15b1 or 215b1 of the first remaining mask patterns 15b or 215b, and second patterns 30b or 230b spaced apart from the first remaining mask patterns 15b or 215b.

In the example embodiment described with reference to FIGS. 1 to 16, two of the first mask patterns 15c and three of the second mask patterns 30 may be formed at the first pitch Pa. Thus, the first sacrificial patterns 10 may be formed using an exposure apparatus, and one (or a pair of) first sacrificial pattern 10 formed at the first pitch Pa may be formed into a total of five mask patterns 15c and 30, by using a deposition process and an etching process without the exposure apparatus, as illustrated in FIG. 16. Thus, according to example embodiments, a patterning method in which the patterning resolution of the exposure apparatus may be further improved by five times may be provided.

In the example embodiment described with reference to FIGS. 22 to 33, two of the first mask patterns 215c and four of the second mask patterns 230 may be formed at the first pitch Pb. Thus, the first sacrificial patterns 210 may be formed using an exposure apparatus, and one (or a pair of) first sacrificial pattern 210 formed at the first pitch Pb may be formed into a total of six mask patterns 215c and 230 by using a deposition process and an etching process without the exposure apparatus, as illustrated in FIG. 33. Thus, according to example embodiments, a patterning method in which the patterning resolution of the exposure apparatus may be further improved by six times, may be provided.

As in the example embodiments, five or six mask patterns may be formed using sacrificial patterns of one pitch Pa or Pb that may be formed by an exposure apparatus. By forming the semiconductor device using the mask patterns formed as described above, the degree of integration of the semiconductor device may be improved.

As set forth above, according to example embodiments, methods of forming a fine pattern, in which an optical resolution limit of an exposure apparatus may be reduced, and methods of forming a semiconductor device by using the method of forming fine patterns, may be provided.

While example embodiments have been shown and described above, it will be apparent to those skilled in the art that modifications and variations could be made without departing from the scope of the present inventive concepts as defined by the appended claims.

What is claimed is:

1. A method of forming a semiconductor device, comprising:
    forming first sacrificial patterns on a lower structure;
    forming first remaining mask layers extending on sidewalls of and extending between the first sacrificial patterns to be in contact with the first sacrificial patterns;
    forming first remaining mask patterns by patterning the first remaining mask layers, the first remaining mask patterns including respective horizontal portions that are parallel to an upper surface of the lower structure, and respective vertical portions that are perpendicular to the upper surface of the lower structure;
    forming second mask patterns spaced apart from the respective vertical portions of the first remaining mask patterns;
    removing the first sacrificial patterns after forming the second mask patterns; and
    after removing the first sacrificial patterns, forming first mask patterns by etching the respective horizontal portions of the first remaining mask patterns, each of the first mask patterns including a portion of a respective one of the vertical portions of the first remaining mask patterns,
    wherein the forming first remaining mask layers in contact with the first sacrificial patterns comprises:
    forming a first mask layer having a first thickness on the lower structure on which the first sacrificial patterns are formed, the first mask layer extending on the sidewalls and upper surfaces of the first sacrificial patterns and on the lower structure between the first sacrificial patterns;
    forming second sacrificial patterns on the first mask layer between the first sacrificial patterns, wherein the second sacrificial patterns are separated from the lower structure by the first mask layer extending between the first sacrificial patterns; and
    removing portions of the first mask layer that are disposed on the first sacrificial patterns between the second sacrificial patterns.

2. The method of claim 1, wherein the respective vertical portions of the first remaining mask patterns are disposed between a respective pair of the second mask patterns, and wherein the respective horizontal portions of the first remaining mask patterns are in contact with one of the second mask patterns of the respective pair but are spaced apart from another of the second mask patterns of the respective pair.

3. The method of claim 1, wherein the first sacrificial patterns each have a first width,
    the first sacrificial patterns are spaced apart from each other by a first distance that is greater than the first width, and
    the first thickness is less than the first width.

4. The method of claim 1, wherein the forming first remaining mask patterns by patterning the first remaining mask layers, comprises:
    etching the first and second sacrificial patterns to expose upper regions of the first remaining mask layers;
    forming upper spacers on sides of the upper regions of the first remaining mask layers;
    etching the first and second sacrificial patterns by using the first remaining mask layers and the upper spacers as an etch mask; and then
    anisotropically etching the first remaining mask layers by using the first and second sacrificial patterns to form the first remaining mask layers of a "U" shape into the first remaining mask patterns of an "L" shape.

5. The method of claim 4, wherein each of the second mask patterns has a thickness equal to the first thickness of the first mask layer and comprises a same material as a material of the first mask layer.

6. The method of claim 5, further comprising removing the second sacrificial patterns while removing the first sacrificial patterns, after forming the second mask patterns.

7. The method of claim 6, wherein the forming first mask patterns by etching the respective horizontal portions of the first remaining mask patterns comprises:
    anisotropically etching the first remaining mask patterns of the "L" shape after removing the first and second sacrificial patterns.

8. The method of claim 1, further comprising:
    forming trenches defining active regions by etching the lower structure using the first and second mask patterns as an etch mask; and
    forming isolation regions in the trenches, wherein the first and second mask patterns are removed while forming the isolation regions or after forming the isolation regions.

9. The method of claim 1, wherein the lower structure comprises a conductive layer and a capping insulating layer that are sequentially stacked.

10. The method of claim 9, further comprising:
    forming capping insulating patterns remaining below the first and second mask patterns by etching the capping insulating layer by using the first and second mask patterns as an etching mask; and
    forming conductive patterns by etching the conductive layer below the capping insulating patterns,
    wherein the first and second mask patterns are removed while forming the capping insulating patterns, or are removed after forming the capping insulating patterns.

11. A method of forming a semiconductor device, comprising:
    forming first sacrificial patterns on a lower structure, the first sacrificial patterns having respective first widths, and the first sacrificial patterns that are immediately adjacent being spaced apart from each other by respective first distances that are greater than the respective first widths;
    forming first remaining mask patterns between the first sacrificial patterns and in contact with the first sacrificial patterns, the first remaining mask patterns including respective horizontal portions that are parallel to an upper surface of the lower structure, and respective vertical portions that are perpendicular to the upper surface of the lower structure;
    forming second mask patterns spaced apart from the respective vertical portions of the first remaining mask patterns;

removing the first sacrificial patterns remaining after forming the second mask patterns, wherein opposing side surfaces of the vertical portions of the first remaining mask patterns are exposed after removing the first sacrificial patterns; and after removing the first sacrificial patterns, forming first mask patterns by anisotropically etching the first remaining mask patterns while the opposing side surfaces of the vertical portions of the first remaining mask patterns are exposed, each of the first mask patterns including a portion of a respective one of the vertical portions of the first remaining mask patterns.

12. The method of claim 11, wherein the first mask patterns and the second mask patterns are formed of a same material and formed to have a same width.

13. The method of claim 11, wherein the forming first remaining mask patterns in contact with the first sacrificial patterns comprises:

forming a first mask layer on the first sacrificial patterns at a first thickness, the first mask layer extending on sides and upper surfaces of the first sacrificial patterns and on the upper surface of the lower structure between the first sacrificial patterns;

forming second sacrificial patterns on the first mask layer between the first sacrificial patterns, wherein the second sacrificial patterns are separated from the upper surface of the lower structure by the first mask layer on the upper surface of the lower structure between the first sacrificial patterns; and removing portions of the first mask layer that are disposed on the first sacrificial patterns between the second sacrificial patterns.

14. The method of claim 13, wherein a ratio of a size of the respective first widths to a size of the respective first distances is about 3 to 7, and wherein the first thickness is about one-third the size of the respective first widths.

15. The method of claim 13, wherein a ratio of a size of the respective first widths to a size of the respective first distances is about 5 to 7, and wherein the first thickness is about one-fifth the size of the respective first widths.

16. The method of claim 11, wherein before forming the first mask patterns, the second mask patterns include first patterns in contact with the respective horizontal portions of the first remaining mask patterns, and second patterns spaced apart from the respective horizontal portions of the first remaining mask patterns.

17. The method of claim 11, wherein an entirety of the first sacrificial patterns are removed after forming the second mask patterns and before forming the first mask patterns.

18. A method of forming a semiconductor device, comprising:

forming first remaining mask patterns on a lower structure, the first remaining mask patterns including respective horizontal portions that are parallel to an upper surface of the lower structure, and respective vertical portions extending from the respective horizontal portions in a direction perpendicular to the upper surface of the lower structure;

forming second mask patterns on the lower structure, after forming the first remaining mask patterns, wherein the second mask patterns comprise first patterns in contact with the respective horizontal portions of the first remaining mask patterns, and second patterns, each of which is spaced apart from all of the first remaining mask patterns; and after forming the second mask patterns, forming first mask patterns, each of which includes a portion of a respective one of the vertical portions of the first remaining mask patterns, by removing the respective horizontal portions of the first remaining mask patterns while opposing side surfaces of the second patterns of the second mask patterns are exposed, wherein the forming first remaining mask patterns and second mask patterns on the lower structure comprises:

forming first sacrificial patterns on the lower structure, the first sacrificial patterns having respective first widths, the first sacrificial patterns being spaced apart from each other by respective first distances that are greater than the respective first widths;

forming a first mask layer on the lower structure on which the first sacrificial patterns are formed, the first mask layer having a first thickness smaller than the respective first widths;

forming second sacrificial patterns on the first mask layer between the first sacrificial patterns;

forming a first remaining mask layer by removing portions of the first mask layer on the first sacrificial patterns between the second sacrificial patterns;

etching the first and second sacrificial patterns to expose upper regions of the first remaining mask layer;

forming upper spacers on the first and second sacrificial patterns to extend on sides of the upper regions of the first remaining mask layer;

forming first and second sacrificial spacers by etching the first and second sacrificial patterns using the first remaining mask layer and the upper spacers as an etch mask;

etching the first remaining mask layer by an anisotropic etching process, using the upper spacers as an etch mask, to form the first remaining mask patterns;

forming the second mask patterns on sides of the first and second sacrificial spacers; and removing the upper spacers and the first and second sacrificial spacers.

19. The method of claim 18, wherein:

each of the first sacrificial patterns defines two of the first sacrificial spacers that are spaced apart from each other, and each of the second sacrificial patterns defines two of the second sacrificial spacers that are spaced apart from each other, responsive to the etching of the first and second sacrificial patterns using the first remaining mask layer and the upper spacers as an etch mask;

the first patterns of the second mask patterns are formed on respective sides of the two of the second sacrificial spacers, and are in contact with the respective horizontal portions of the first remaining mask patterns; and the second patterns of the second mask patterns are spaced apart from the respective horizontal portions of the first remaining mask patterns while being formed between the two of the first sacrificial spacers.

* * * * *